United States Patent
Taniguchi

(10) Patent No.: US 7,927,421 B2
(45) Date of Patent: Apr. 19, 2011

(54) LIGHT IRRADIATION APPARATUS, LIGHT IRRADIATION METHOD, CRYSTALLIZATION APPARATUS, CRYSTALLIZATION METHOD, AND SEMICONDUCTOR DEVICE

(75) Inventor: Yukio Taniguchi, Yokohama (JP)

(73) Assignee: Advanced LCD Technologies Development Center Co., Ltd., Yokohama-shi (JP)

( * ) Notice: Subject to any disclaimer, the term of this patent is extended or adjusted under 35 U.S.C. 154(b) by 1068 days.

(21) Appl. No.: 11/687,113

(22) Filed: Mar. 16, 2007

(65) Prior Publication Data
US 2007/0215037 A1  Sep. 20, 2007

(30) Foreign Application Priority Data
Mar. 17, 2006 (JP) .................. 2006-073970

(51) Int. Cl.
*C30B 1/02* (2006.01)
(52) U.S. Cl. .......... 117/4; 117/7; 117/8; 117/9; 117/202
(58) Field of Classification Search .................. 117/4, 7, 117/8, 9, 202
See application file for complete search history.

(56) References Cited

U.S. PATENT DOCUMENTS
5,367,404 A  11/1994 Hayata
2004/0214414 A1  10/2004 Matsumura et al.

FOREIGN PATENT DOCUMENTS
JP  2004-343073  12/2004

OTHER PUBLICATIONS

Y. Taniguchi, "A Novel Phase-Modulator for ELA-Based Lateral Growth of SI", The Electrochemical Society's 206th Meeting, Thin Film Transistor Technologies VII (Honolulu, Hawaii), Oct. 3-8, 2004, 3 pages.

*Primary Examiner* — Robert M Kunemund
(74) *Attorney, Agent, or Firm* — Oblon, Spivak, McClelland, Maier & Neustadt, L.L.P.

(57) ABSTRACT

A light irradiation apparatus irradiates a target plane with light having a predetermined light intensity distribution. The apparatus includes a light modulation element having a light modulation pattern of a periodic structure represented by a primitive translation vector (a1, a2), an illumination system for illuminating the modulation element with the light, and an image forming optical system for forming the predetermined light intensity distribution obtained by the modulation pattern on the target plane. A shape of an exit pupil of the illumination system is similar to the Wigner-Seitz cell of a primitive reciprocal lattice vector (b1, b2) obtained from the primitive translation vector (a1, a2) by the following equations:

$$b1 = 2\pi(a2 \times a3)/(a1 \cdot (a2 \times a3))$$ and $$b2 = 2\pi(a3 \times a1)/(a1 \cdot (a2 \times a3))$$

in which a3 is a vector having an arbitrary size in a normal direction of a flat surface of the modulation pattern of the modulation element, "·" is an inner product of the vector, and "×" is an outer product of the vector.

10 Claims, 19 Drawing Sheets

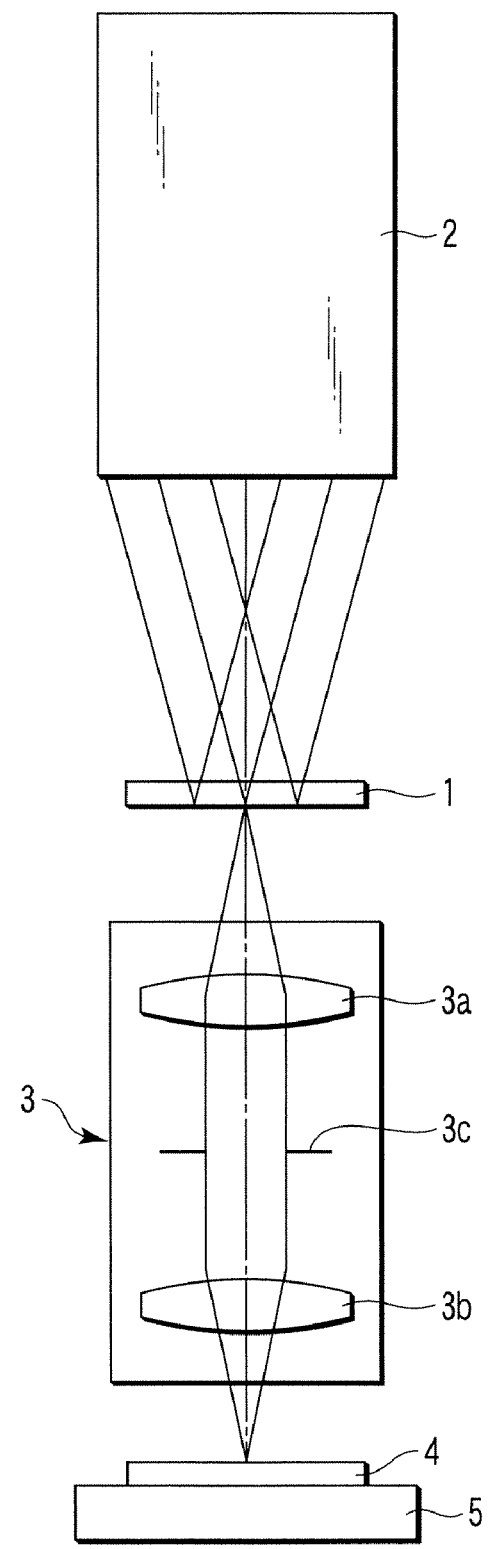
F I G. 1

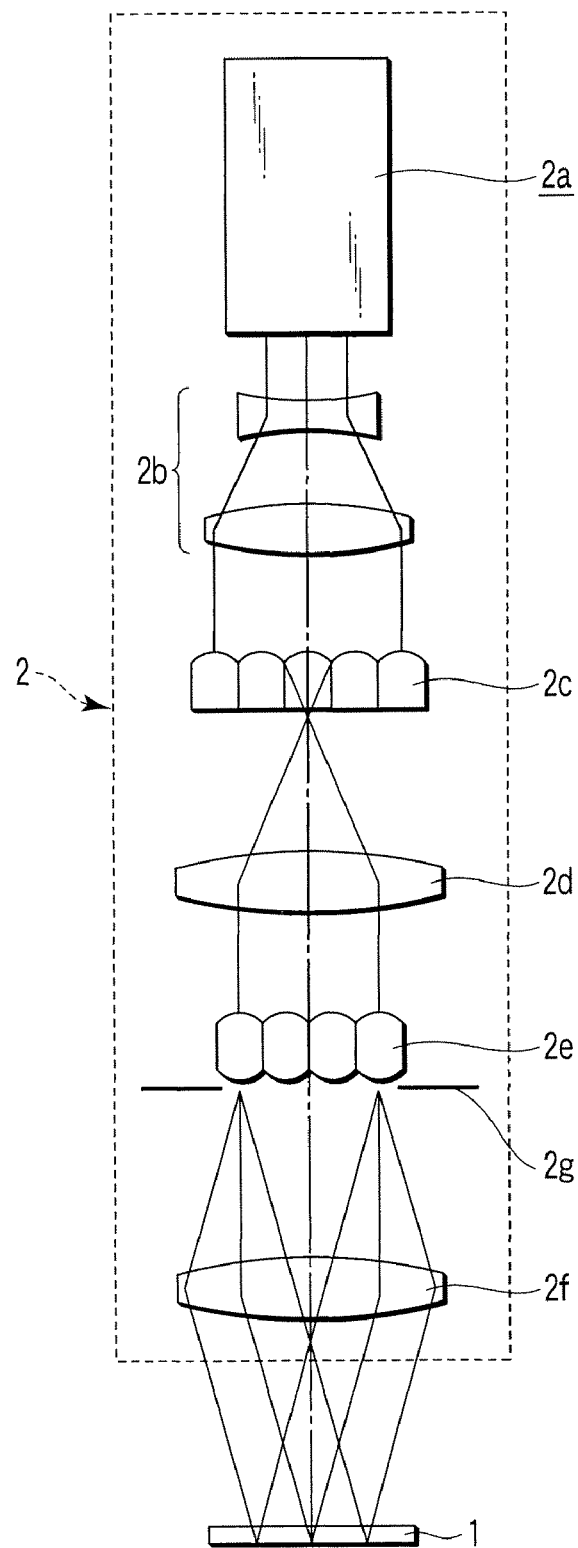
F I G. 2

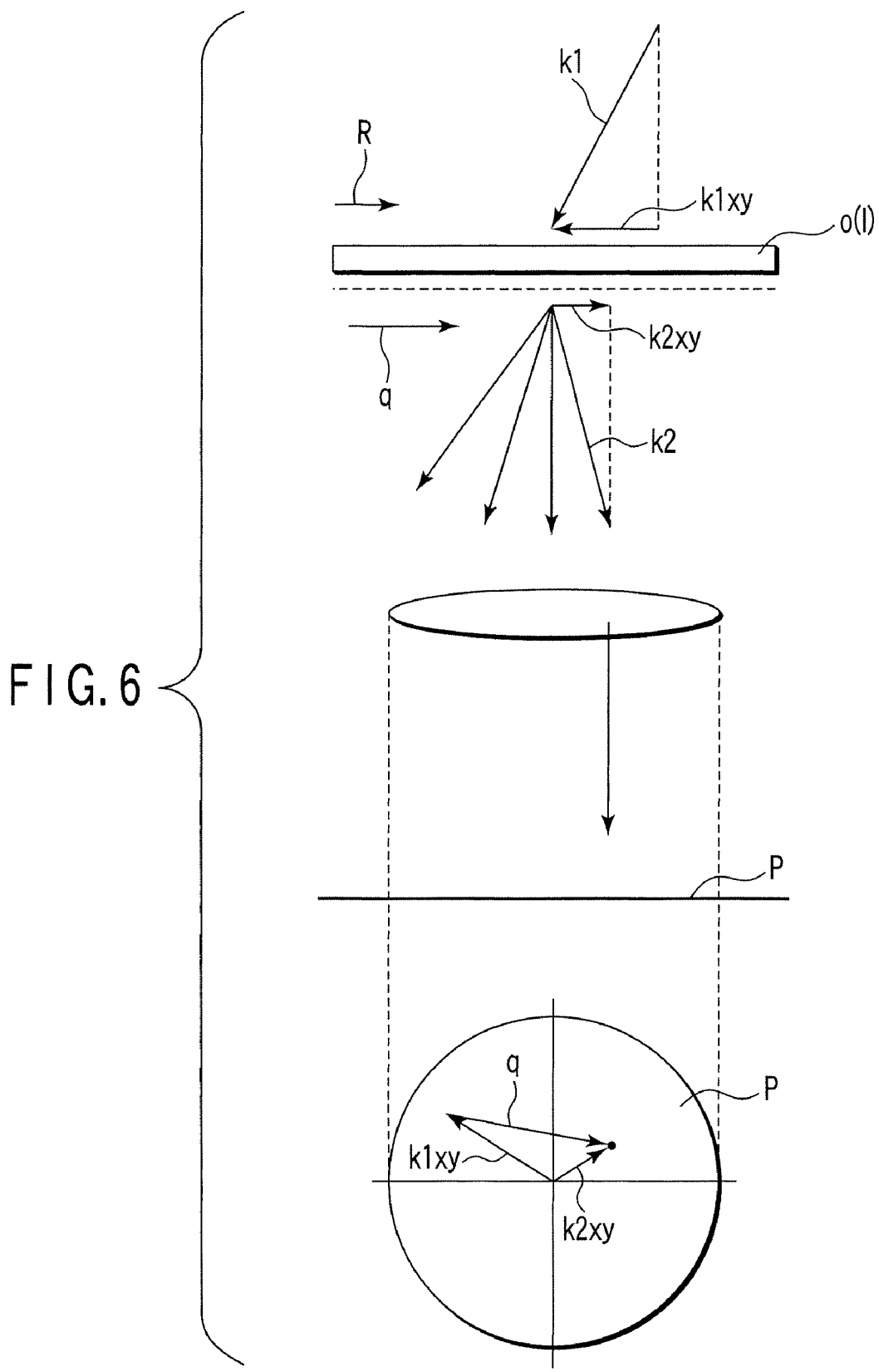

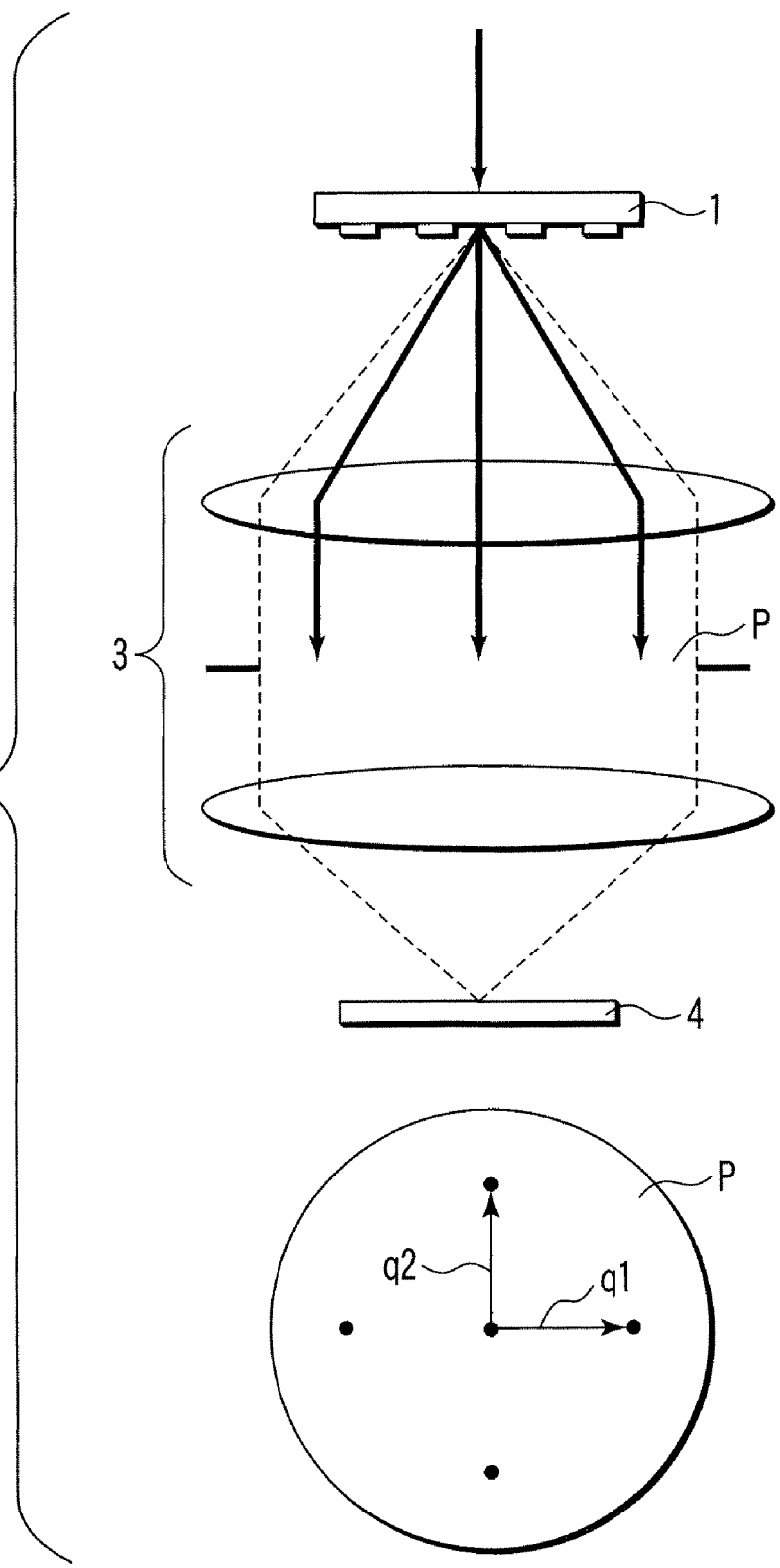

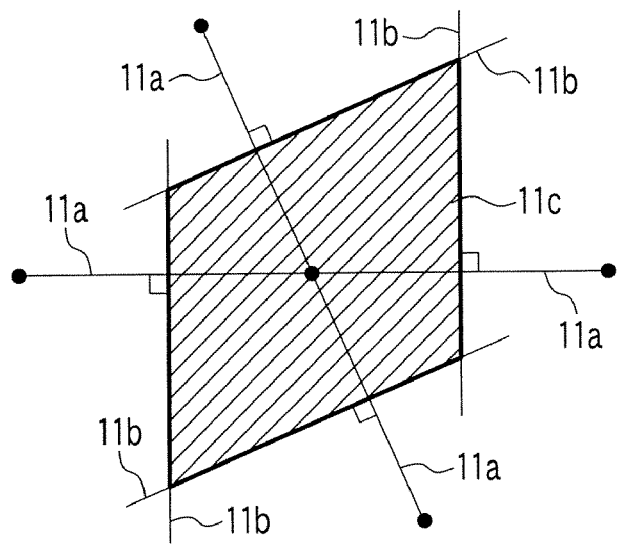
F I G. 11
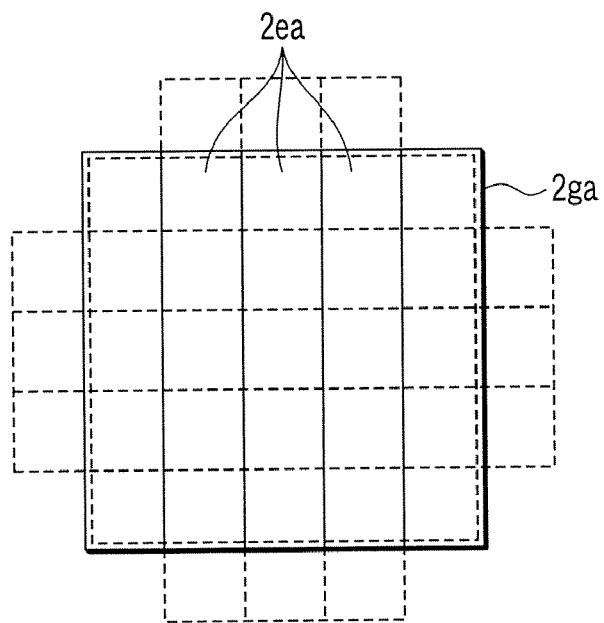
F I G. 13

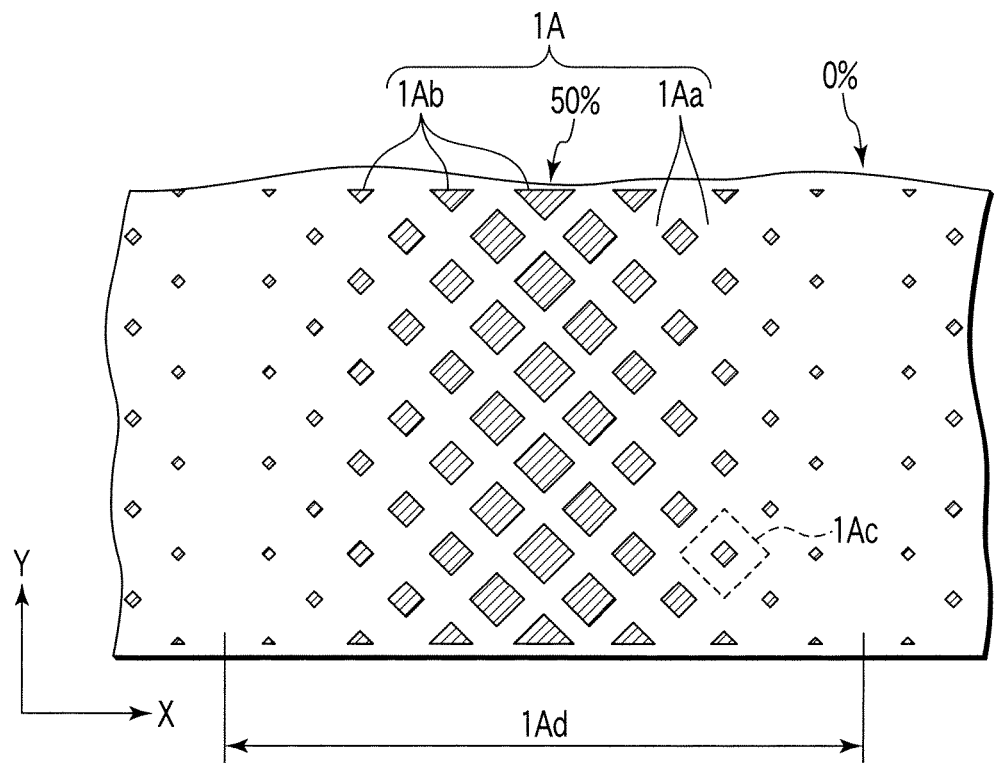
F I G. 16
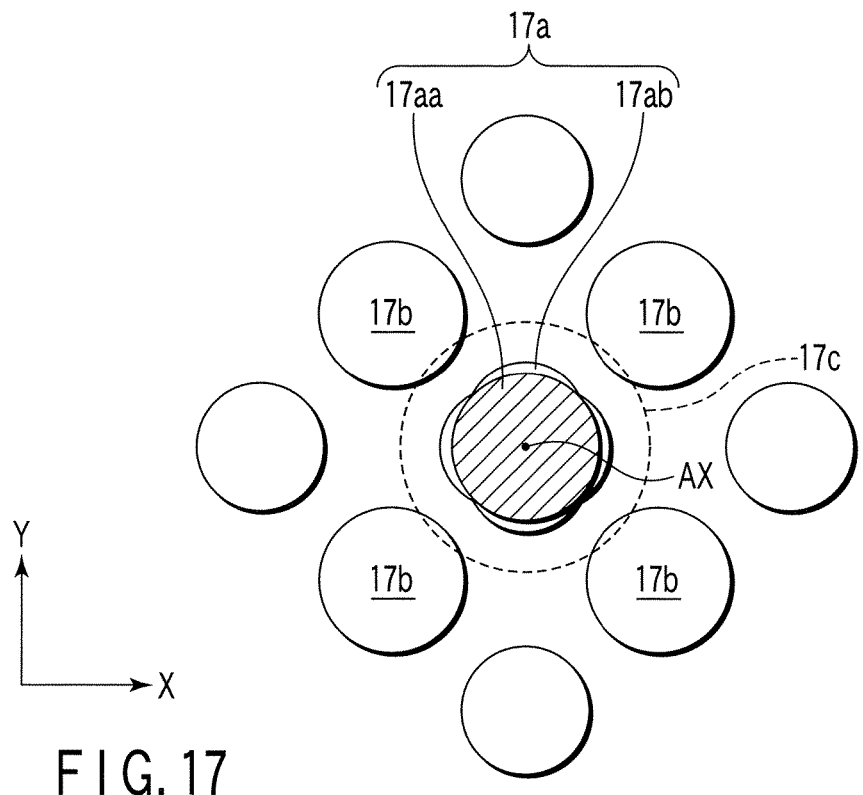
F I G. 17

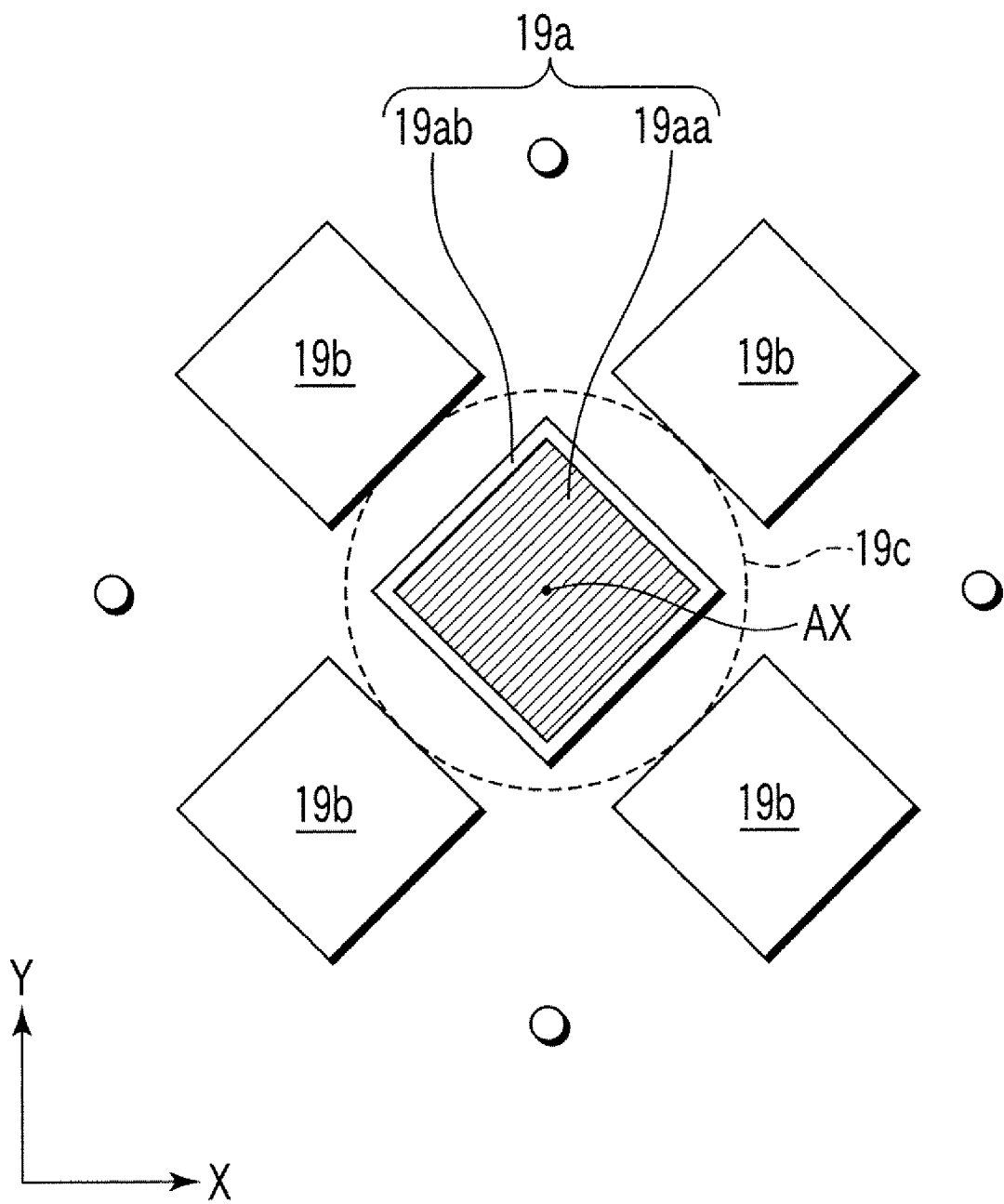
F I G. 19

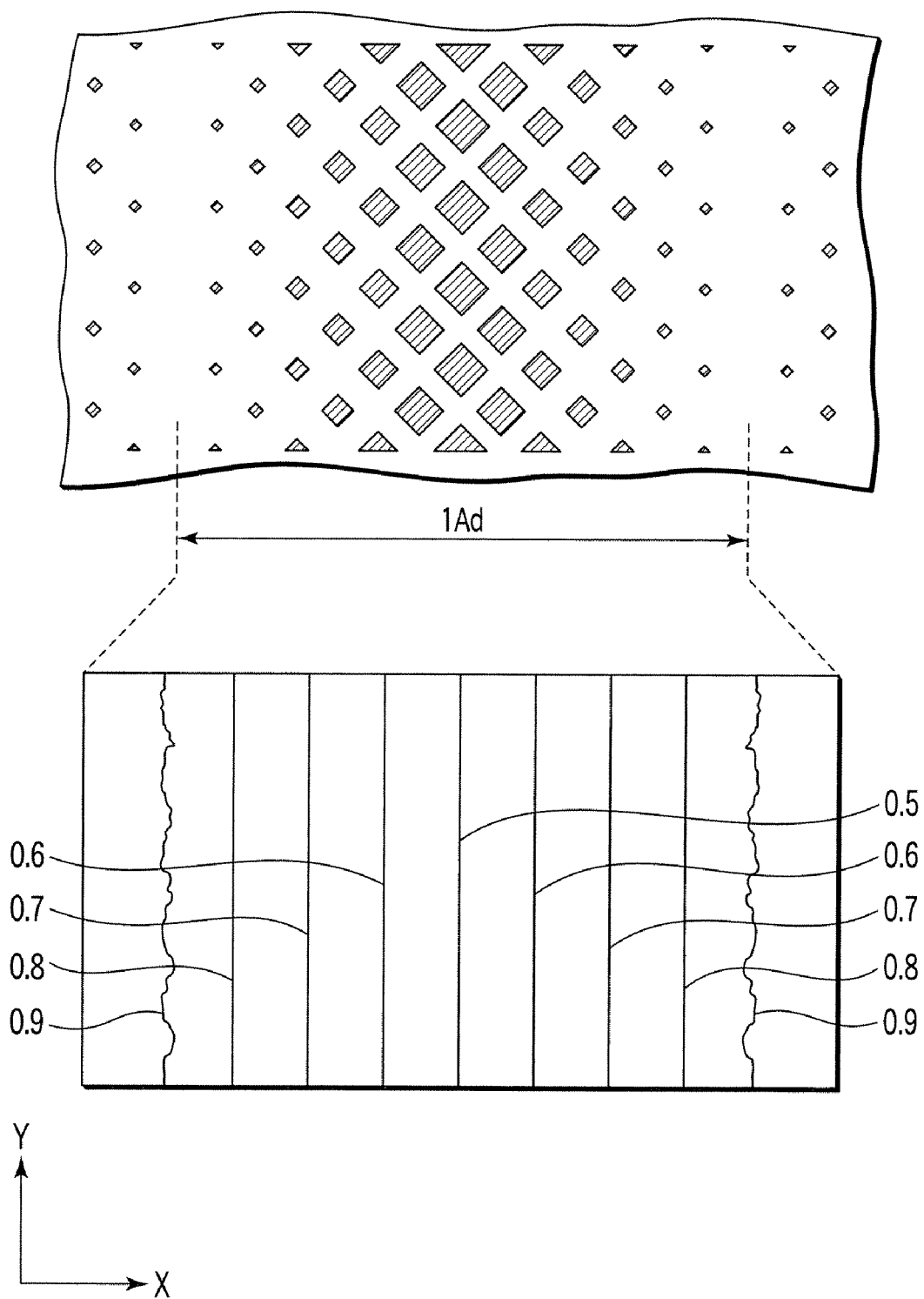
F I G. 20

LIGHT IRRADIATION APPARATUS, LIGHT IRRADIATION METHOD, CRYSTALLIZATION APPARATUS, CRYSTALLIZATION METHOD, AND SEMICONDUCTOR DEVICE

CROSS-REFERENCE TO RELATED APPLICATIONS

This application is based upon and claims the benefit of priority from prior Japanese Patent Application No. 2006-073970, filed Mar. 17, 2006, the entire contents of which are incorporated herein by reference.

BACKGROUND OF THE INVENTION

1. Field of the Invention

The present invention relates to a light irradiation apparatus, a light irradiation method, a crystallization apparatus, and a crystallization method, and relates to, e.g., a technology of irradiating a non-single crystal semiconductor film with a laser beam having a predetermined light intensity distribution to generate a crystallized semiconductor film.

2. Description of the Related Art

A thin film transistor (TFT) used for, e.g., a switching element that selects a display pixel in a liquid crystal display (LCD) and the like is conventionally formed of amorphous silicon or poly-crystal silicon. It is known that poly-crystal silicon has a high mobility of electrons or holes than that of amorphous silicon.

Therefore, when a transistor is formed of poly-crystal silicon, a switching speed becomes higher and a display response speed also becomes higher than those in an example where a transistor is formed of amorphous silicon. Further, an LSI arranged at a peripheral portion of the device, e.g., a driver circuit or a DAC can be constituted of a thin film transistor to operate at a higher speed. Furthermore, there is also an advantage of, e.g., a reduction in design margins of other components.

Since poly-crystal silicon is made of an aggregation of crystal grains, when, switching transistor such as a TFT transistor is formed of poly-crystal silicon, crystal grain boundaries inherently present in a channel region of the transistor. These crystal grain boundaries serve as barriers, and hence a mobility of electrons or holes becomes lower than that of a TFT transistor formed of single-crystal silicon. Many thin film transistors respectively formed of poly-crystal silicon, the number of crystal grain boundaries formed in a channel region differs depending on each thin film transistor. This difference becomes unevenness, resulting in a problem of display unevenness in case of a liquid crystal display using such a transistor. Thus, in order to improve the mobility of electrons or holes and reduce unevenness in the number of crystal grain boundaries in the channel portion, a crystallization method of generating crystallized silicon or poly-crystal silicon having a large particle diameter that enables forming at least one channel region has been proposed.

As this type of crystallization method, the following technology has been conventionally proposed. That is, according to this technology, an incident laser beam is modulated into a laser beam having a V-shaped light intensity distribution that one-dimensionally varies in a predetermined direction by using a light modulation element (a phase shifter), as follows. The modulation element has a phase pattern in which an area share ratio of a phase modulation region in a unit area one-dimensionally varies in a predetermined direction. A non-single crystal semiconductor film (a poly-crystal semiconductor film or a non-single crystal semiconductor film) is irradiated with this modulated laser beam, so that the film is subjected to crystal growth in the predetermined direction, thereby generating a crystallized semiconductor film (see, e.g., KOKAI 2004-343073, and Y. Taniguchi, etc., "A Novel Phase-modulator for ELA-based Lateral Growth of Si", The electrochemical Society's 206th Meeting, Thin Film Transistor Technologies VII (Honolulu, Hi.)).

As shown in FIG. 22A, a conventional crystallization technology proposed in the document uses a light modulation element 101 having a phase pattern in which an area share ratio of a phase modulation region in a unit region one-dimensionally varies in a predetermined direction (a horizontal direction in FIG. 22A). In this figure, each hatched square region 101a is the phase modulation region, and its area is reduced from a central part toward a peripheral part. A laser beam modulated via this light modulation element 101 has a V-shaped light intensity distribution that one-dimensionally varies on an image plane of an image forming optical system, that is an irradiated surface of the silicon film. Specifically, when a phase modulation amount of the phase modulation region 101a of the light modulation element 101 is 60 degrees, a V-shaped light intensity distribution 102 indicated by a thick solid line in FIG. 22B is theoretically generated. Further, when a phase modulation amount of the phase modulation region of the light modulation element 101 is 180 degrees, a V-shaped light intensity distribution 103 indicated by a thick solid line in FIG. 22B is theoretically generated, and a V-shaped light intensity distribution 104 indicated by a thin solid line in FIG. 22B is actually produced. When a non-single crystal semiconductor film is irradiated with a laser beam having a V-shaped light intensity distribution generated in this manner, a crystal grows in a gradient direction of the light intensity distribution, and each needle-like crystal 105 that extends in the gradient direction from a central part where a light intensity is low is generated as shown in FIG. 22C.

In a conventional crystallization technology, when a coherence factor, that is, a σ-value (an emission-side numerical aperture of an illumination system/an object-side numerical aperture of an image forming optical system) is set to a comparatively small value (e.g., 0.5 or less), a desired light intensity distribution can be generated. However, if the σ-value is set to a comparatively large value (e.g., 0.6 or less), for example, a wavelike undulation is generated on a contour line indicating a light intensity, and the desired light intensity distribution cannot be generated. As a result, unevenness is generated in the growth of the crystals, the crystal grains having a desired shape cannot be generated, and in consequence, electric properties of the manufactured TFT inconveniently fluctuate.

BRIEF SUMMARY OF THE INVENTION

An object of the present invention is to provide a crystallization apparatus and a crystallization method capable of generating a desired light intensity distribution, even if a coherence factor is set to a comparatively large value, and in consequence, capable of generating crystal grains having a desired shape.

A light irradiation apparatus which irradiates an irradiation target plane with light having a predetermined light intensity distribution according to a first aspect of the present invention comprises a light modulation element having a light modulation pattern of a periodic structure represented by a primitive translation vector (a1, a2), an illumination system which has an exit pupil and, illuminates the light modulation element with the light, and an image forming optical system disposed between the light modulation element and the irradiation target plane to form the predetermined light intensity distribution of the light obtained by the light modulation pattern on the irradiation target plane. A shape of the exit pupil of the illumination system is similar to the Wigner-Seitz cell of a primitive reciprocal lattice vector (b1, b2) obtained from the primitive translation vector (a1, a2) by the following equations:

$$b1=2\pi(a2 \times a3)/(a1 \cdot (a2 \times a3)) \text{ and}$$

$$b2=2\pi(a3 \times a1)/(a1 \cdot (a2 \times a3))$$

in which a3 is a vector having an arbitrary size in a normal direction of a flat surface of the light modulation pattern of the light modulation element, "·" is an inner product of the vector, and "×" is an outer product of the vector.

A light irradiation apparatus which irradiates an irradiation target plane with light having a predetermined light intensity distribution according to a second aspect of the present invention comprises a light modulation element having a light modulation pattern of a periodic structure represented by a primitive translation vector (a1, a2), an illumination system which has an exit pupil, and illuminates the light modulation element, and an image forming optical system disposed between the light modulation element and the irradiation target plane to form the predetermined light intensity distribution of the light corresponding to the light modulation pattern on the irradiation target plane. A shape of the exit pupil of the illumination system is not a convex shape with respect to a direction of a primitive reciprocal lattice vector (b1, b2) obtained from the primitive translation vector (a1, a2) by the following equations:

$$b1=2\pi(a2 \times a3)/(a1 \cdot (a2 \times a3)) \text{ and}$$

$$b2=2\pi(a3 \times a1)/(a1 \cdot (a2 \times a3))$$

in which a3 is a vector having an arbitrary size in a normal direction of a light modulation pattern plane of the light modulation element, "·" is an inner product of the vector, and "×" is an outer product of the vector A light irradiation apparatus which irradiates an irradiation target plane with a light beam having a predetermined light intensity distribution according to a third aspect of the present invention comprises a light modulation element which optically modulates incident light to emit the modulated light;

an illumination system which has an exit pupil, and illuminates the light modulation element, an image forming optical system disposed between the light modulation element and the irradiation target plane to form the predetermined light intensity distribution of the light corresponding to the modulated light on the irradiation target plane, and an exit pupil shape setting section which sets a shape of the exit pupil of the illumination system to a shape other than a circular shape which allows zeroth order diffracted light from the light modulation element to pass and which does not allow first order diffracted light to substantially pass through an opening of a pupil surface of the image forming optical system.

An according to a fourth aspect of the present invention there is provided a light irradiation method to irradiate an irradiation target plane with light having a predetermined light intensity distribution by use of a light modulation element which optically modulates incident light and an image forming optical system disposed between the light modulation element and the irradiation target plane, wherein a shape of an exit pupil of an illumination system which illuminates the light modulation element is set to a shape other than a circular shape which does not allow a first order diffracted light component of the light from the light modulation element to substantially pass through an opening of a pupil surface of the image forming optical system.

In the present invention, a shape of an exit pupil of an illumination system may be set to a shape (e.g., a Wigner-Seitz cell shape) other than a circular shape which does not allow first order diffracted light from a light modulation element to substantially pass through an opening of an pupil surface of an image forming optical system. Therefore, in a light intensity distribution generated on an image plane of the image forming optical system, any wavelike undulation is not substantially generated on a contour line of a light intensity. As a result, in a crystallization apparatus of the present invention, even if a σ-value (a coherence factor) is set to a comparatively large value, a desired light intensity distribution can be generated, and in consequence, crystal grains having a desired shape can be generated.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIG. 1 is a diagram schematically showing a constitution of a crystallization apparatus according to one embodiment of the present invention;

FIG. 2 is a diagram schematically showing an internal structure of an illumination system of the crystallization apparatus shown in FIG. 1;

FIGS. 4A and 4B are explanatory views of a light intensity distribution formed on a processing target substrate by use of a light modulation element similar to the light modulation element shown in FIG. 3 at a time when an exit pupil of an illumination system is formed into a circular shape and a σ-value is set to 0.5, wherein FIG. 4A is a diagram schematically showing the light modulation element, and FIG. 4B is a diagram schematically showing the light intensity distribution;

FIGS. 5A and 5B are explanatory views of a light intensity distribution formed on a processing target substrate by use of a light modulation element similar to the light modulation element shown in FIG. 3 at a time when an exit pupil of an illumination system is formed into a circular shape and a σ-value is set to 0.6, wherein FIG. 5A is a diagram schematically showing the light modulation element, and FIG. 5B is a diagram schematically showing the light intensity distribution;

FIG. 6 is an explanatory view of a light distribution generated on a pupil surface of an image forming optical system by an object having a periodic structure, and in this figure, a pupil surface P is shown in both of a side view and a plan view;

FIG. 7 is a diagram showing that a light intensity distribution becomes a lattice structure in a pupil surface of an image forming optical system during coherent illumination, and in this figure, a pupil surface P is shown in both of a side view and a plan view;

FIG. 11 is an explanatory view of a method of manufacturing the Wigner-Seitz cell;

FIGS. 12A an 12B are explanatory views of an effect obtained at a time when a shape of an exit pupil of an illumination system is formed into a Wigner-Seitz cell shape, wherein FIG. 12A shows a case where the shape of the exit pupil is set to a circular shape.

FIG. 13 is a diagram showing that a shape of an opening of an aperture stop of an illumination system is set to a square shape as a Wigner-Seitz cell shape;

FIGS. 15A and 15B are explanatory views of a light intensity distribution formed on a processing target substrate by use of a light modulation element similar to the light modulation element shown in FIG. 3 at a time when a shape of an exit pupil of an illumination system is set to a Wigner-Seitz cell shape and a σ-value is set to a value corresponding to 0.6, wherein FIG. 15A is a diagram schematically showing the light modulation element, and FIG. 15B is a diagram schematically showing the light intensity distribution;

FIG. 16 is a diagram schematically showing a constitution of a light modulation element according to a modification;

FIG. 17 is a diagram schematically showing a calculation result of a light intensity distribution obtained in a pupil surface of an image forming optical system by use of the light modulation element of FIG. 16 at a time when a shape of an exit pupil of an illumination system is set to a circular shape and a σ-value is set to 0.6;

FIG. 19 is a diagram schematically showing a calculation result of a light intensity distribution obtained in a pupil surface of an image forming optical system by use of the light modulation element of FIG. 16 at a time when a shape of an exit pupil of an illumination system is set to a Wigner-Seitz cell shape and a σ-value is set to a value corresponding to 0.6;

FIG. 20 is a diagram schematically showing a light intensity distribution formed on a processing target substrate by use of the light modulation element of FIG. 16 at a time when a shape of an exit pupil of an illumination system is set to a Wigner-Seitz cell shape and a σ-value is set to a value corresponding to 0.6;

DETAILED DESCRIPTION OF THE INVENTION

Figure 3:
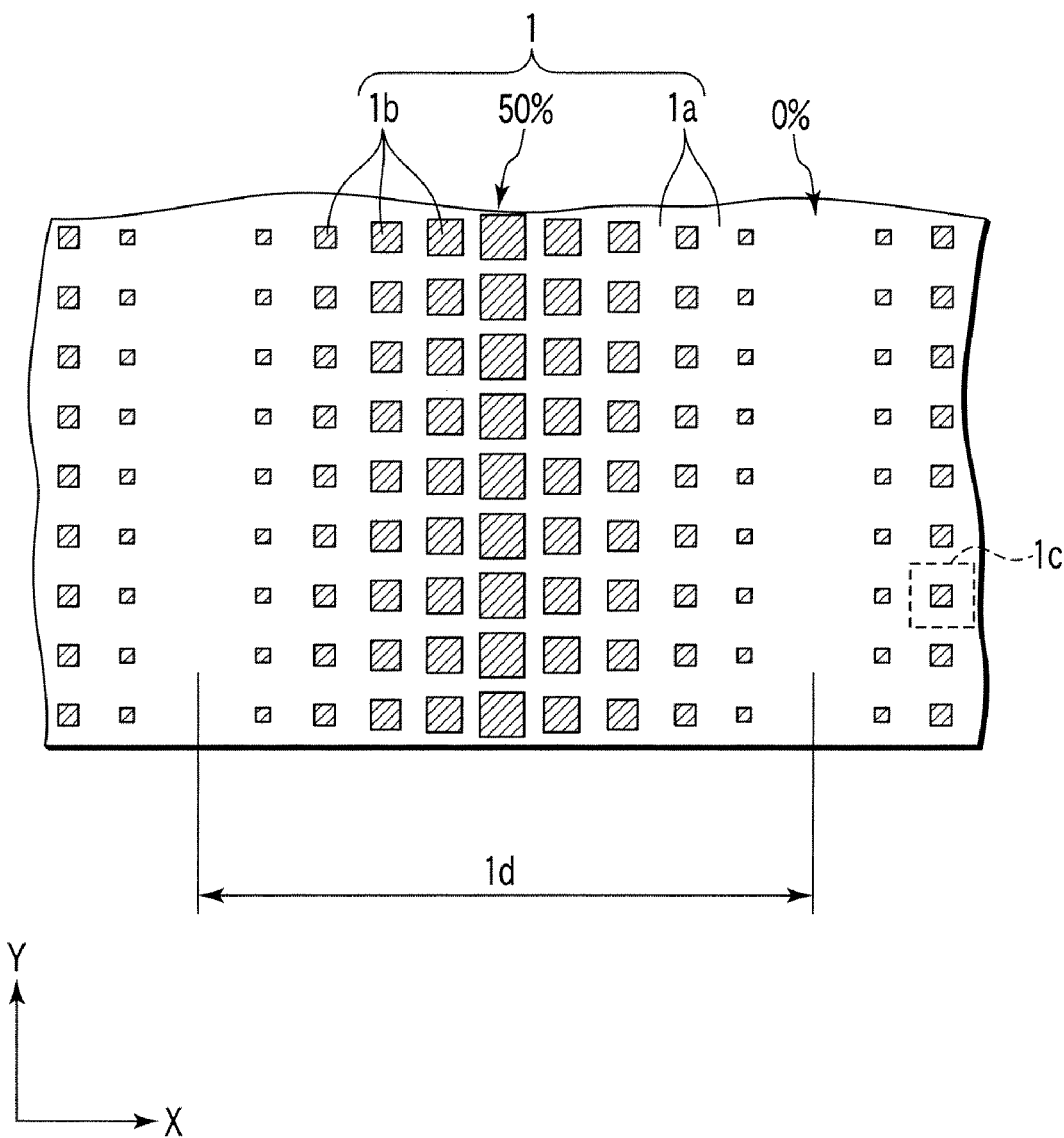
FIG. 3 is a diagram schematically showing a constitution of a part of a light modulation element of the crystallization apparatus shown in FIG. 1.

An embodiment according to the present invention will now be explained with reference to the accompanying drawings. FIG. 1 is a view schematically showing a structure of a crystallization apparatus according to an embodiment of the present invention. FIG. 2 is a view schematically showing an internal structure of an illumination system depicted in FIG. 1. Referring to FIGS. 1 and 2, a crystallization apparatus according to this embodiment includes a light modulation element 1 like a phase shifter that modulates a phase of an incident light (beam) to form a light (beam) having a predetermined light intensity distribution, an illumination system 2 that illuminates the light modulation element 1, an image forming optical system 3, and a substrate stage 5 that holds a processing target substrate 4 having a film of a semiconductor, e.g., non-single crystal silicon.

A structure and a function of the light modulation element 1 will be explained later. The illumination system 2 includes an XeCl excimer laser (beam) source 2a that supplies a laser beam having a wavelength of, e.g., 308 nm. Alternatively, it is possible to use other appropriate beam sources, e.g., a KrF excimer laser beam source or a YAG laser beam source having performance of emitting an energy light ray that fuses an irradiation region of the processing target substrate. A cross section of the laser beam supplied from the beam source 2a is expanded by a beam expander 2b, and then this laser beam enters a first fly-eye lens 2c.

As a result, a plurality of small light sources are formed on a rear focal plane of the first fly-eye lens 2c, and an incidence plane of a second fly-eye lens 2e is illuminated with light beams from the plurality of small light sources via a first condenser optical system 2d in a superimposing manner. Consequently, more small light sources are formed on a rear focal plane of the second fly-eye lens 2e than those on the rear focal plane of the first fly-eye lens 2c. The light modulation element 1 is illuminated with light fluxes from the plurality of small light sources formed on the rear focal plane of the second fly-eye lens 2e via a second condenser optical system 2f in a superimposing manner.

The first fly-eye lens 2c and the first condenser optical system 2d constitute a first homogenizer. This first homogenizer uniforms the laser beam emitted from the beam source 2a in relation to an incidence angle on the light modulation element 1. Further, the second fly-eye lens 2e and the second condenser optical system 2f constitute a second homogenizer. This second homogenizer uniforms the laser beam having the uniformed incidence angle from the first homogenizer in relation to a light intensity at each in-plane position on the light modulation element 1.

In this manner, the illumination system 2 irradiates the light modulation element 1 with the laser beam that has a light intensity distribution with a substantially uniform intensity as a whole.

In the vicinity of an emission surface of the second fly-eye lens 2e, an aperture stop 2g is disposed which limits a cross-section of the luminous flux from the second fly-eye lens 2e into a predetermined sectional shape. That is, the aperture stop 2g defines a shape or dimensions of an exit pupil of the illumination system 2. Accordingly, the aperture stop 2g has a function of setting a coherence factor, that is, a σ-value (an emission-side numerical aperture of the illumination system 2/an object-side numerical aperture of the image forming optical system 3). The shape of the exit pupil of the illumination system 2 means an outer shape of the light beam passing through an illumination pupil of the illumination system 2.

The laser beam subjected to light modulation (phase modulation) by the light modulation element 1 enters the processing target substrate 4 via the image forming optical system 3. Here, a phase pattern plane of the light modulation element 1 and the processing target substrate 4 are arranged at optically conjugate positions of the image forming optical system 3. In other words, an irradiation target plane of the processing target substrate 4 is set to a plane that is optically conjugate with the phase pattern plane of the light modulation element 1 (an image plane of the image forming optical system 3).

The image forming optical system 3 includes a front positive lens group 3a on the beam source side, a rear positive lens group 3b on the processing target substrate side, and an aperture stop 3c arranged between these lens groups. A size of an opening portion (a light transmitting portion) of the aperture stop 3c (i.e., an image-side numerical aperture of the image forming optical system 3) is set to generate a necessary light intensity distribution on an upper surface of the semiconductor film (an irradiation target plane) of the processing target substrate 4. The image forming optical system 3 may be a reflective optical system or a refractive/reflective optical system besides the above-explained refractive optical system.

For example, the processing target substrate 4 is obtained by sequentially forming an underlying insulating film, a non-single crystal film, e.g., an amorphous silicon film, and a cap film on, e.g., a liquid crystal display glass substrate by a chemical vapor deposition (CVD) method. Each of the underlying insulating film and the cap film may be formed by an insulating film of, e.g., $SiO_2$. The underlying insulating film prevents foreign particles, e.g., Na in the glass substrate from entering the amorphous silicon film when the amorphous silicon film directly comes into contact with the glass substrate, and further prevents heat of the amorphous silicon film from being directly transmitted to the glass substrate.

The amorphous silicon film is a semiconductor film to be crystallized. The cap film is heated by a part of a light beam that enters the amorphous silicon film, and stores heat having a temperature realized by this heating. A temperature in a high-temperature portion on an irradiation target plane of the amorphous silicon film is relatively rapidly decreased when incidence of the light beam is interrupted. However, this thermal storage effect alleviates this temperature-down gradient, and facilitates lateral crystal growth with a large particle diameter. The processing target substrate 4 is positioned and held at a predetermined position on the substrate stage 5 by a vacuum chuck or an electrostatic chuck.

FIG. 3 is an enlarged plan view schematically showing a main part of a constitution example of the light modulation element of the crystallization apparatus shown in FIG. 1. As shown in FIG. 3, the light modulation element 1 is constituted by repeatedly densely arranging, in an X-direction, unit regions (each unit region having a range denoted with reference numeral 1d) each having a phase modulation pattern in which patterns subjected to area modulation are arranged in the X-direction. Each of the repeated unit regions 1d is constituted of square unit cells 1c densely arranged vertically and horizontally, as shown by a broken line in the figure. Each unit cell 1c has a reference phase region (shown by a blank portion in the figure) 1a having a reference phase value of 0 degree and a rectangular phase modulation region (shown by a hatched portion in the figure) 1b having a modulating phase value of, for example, 90 degrees. This is formed with square concave and convex patterns on, for example, a transparent flat plate made of, for example, quartz glass.

An area share ratios (duty) D of the phase modulation regions 1b with respect to the unit cell 1c changes in a range of 0% to 50% along the X-direction. Specifically, the area share ratio D of the phase modulation regions 1b in the center of the repeated unit region 1d of a phase pattern is 50%, the area share ratios D of the phase modulation regions 1b on opposite sides of the repeated unit region 1d are 0%, and the area share ratios D of the phase modulation regions 1b monotonously change between the center and the opposite sides. Here, the area share ratio D is defined as a smaller value in a ratio of an area share of the phase modulation region 1b in the unit cell 1c and a ratio of an area share of the reference phase region (the phase modulation region having a phase modulation amount of 0 degree) 1a in the unit cell 1c. The unit cell 1c has a dimension (e.g., 1 μm×1 μm in terms of an image plane of the image forming optical system 3), which is not more than a point image distribution range of the image forming optical system 3.

A light intensity I generated on the image plane of the image forming optical system 3 by zero-dimensional light transmitted through the light modulation element 1 of such a duty modulation type is represented by the following equation (1):

$$I=|U|^2=(2-2\cos\theta)D^2-(2-2\cos\theta)D+1 \quad (1),$$

in which D is an area share ratio (i.e., 0 to 0.5) of the phase modulation region 1b in the unit cell 1c, θ is a phase modulation amount (e.g., 90 degrees) of the phase modulation region 1b, and U is a complex amplitude of the light in the image plane of the image forming optical system 3.

In the present embodiment, the phase modulation amount θ defines as positive a case where a wave surface jumps out in a travel direction of the light. It is also assumed that the light modulation element 1 on an illumination system 2 side is formed into a flat shape, and the light modulation element 1 on an image forming optical system 3 side is formed into a concave and convex shape. Referring to the equation (1), it is understood that, as the area share ratio D of the phase modulation region 1b increases, the light intensity I generated at a corresponding position of the image plane of the image forming optical system 3 decreases. In other words, a change configuration of the area share ratio D of the phase modulation region 1b can appropriately be set to generate a required light intensity distribution in the image plane of the image forming optical system 3.

Figures 4A, 4B:
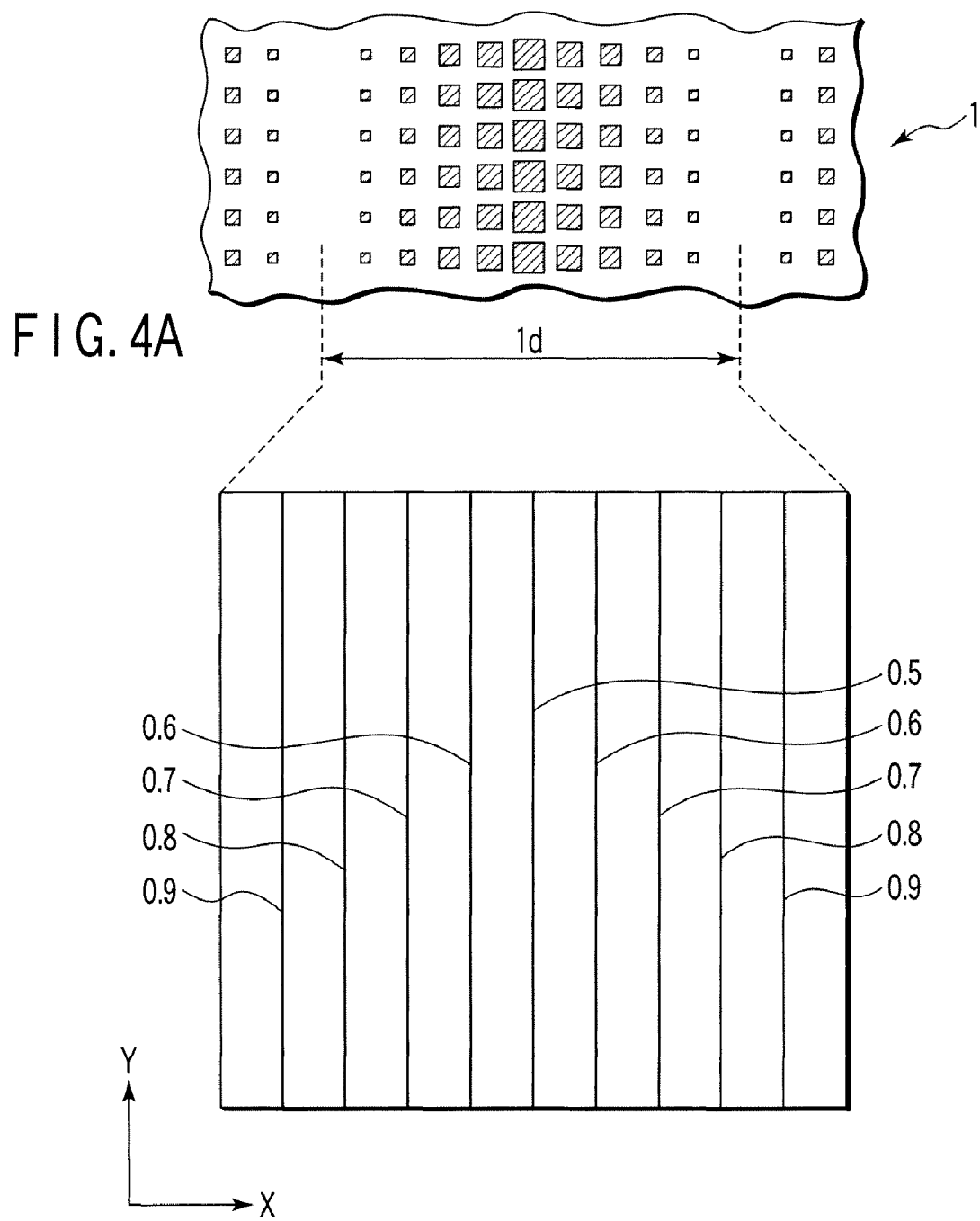

FIGS. 4A and 4B are explanatory views of a light intensity distribution formed on a processing target substrate by use of a light modulation element similar to the light modulation element shown in FIG. 3 at a time when an exit pupil of an illumination system is formed into a circular shape and a σ-value is set to 0.5. FIG. 4A is a diagram schematically showing the light modulation element, and FIG. 4B is a diagram schematically showing the light intensity distribution.

In FIG. 4B, the light intensity distribution theoretically generated in the image plane of the image forming optical system 3 corresponding to one repeated unit region 1d of the light modulation element 1 is shown in the form of a contour line of a light intensity (the light intensity at a time when an intensity in the case of non-modulation is standardized to 1). Hereinafter, the same notation as that of FIG. 4B is used in FIGS. 5B, 15, 18 and 20.

For the calculation of the light intensity distribution shown in FIG. 4B, the shape of the exit pupil of the illumination system 2 (i.e., a shape of a light transmitting portion of the aperture stop 2g) is set to a circular shape, a wavelength of the light is set to 308 nm, an object-side numerical aperture of the image forming optical system 3 is set to 0.2, an emission-side numerical aperture of the illumination system 2 is set to 0.1, and a σ-value is set to 0.5 (0.1/0.2). In FIG. 4B, since the σ-value is set to be comparatively small, a substantially ideal V-shaped light intensity distribution is generated in the image plane of the image forming optical system 3. In the above light intensity distribution, the light intensity I linearly changes in the X-direction from a position corresponding to the center of the repeated unit region 1d to positions corresponding to opposite ends of the region.

In the crystallization apparatus, a temperature gradient is generated in a fused region on a light irradiated region of the processing target substrate 4 in accordance with the substantially ideal V-shaped light intensity distribution. A crystal nucleus or a crystal seed is formed at a first solidified portion or an unfused portion in a region having the lowest light intensity, a lower-end region of the V-shape or a region in the vicinity of the region. Moreover, the crystals grow in a lateral direction from the crystal nuclei to a peripheral portion along the X-direction of the V-shaped light intensity distribution along which the light intensity changes so as to rise. In consequence, crystal grains having a desired shape are generated without unevenness in the crystal growth.

Figures 5A, 5B:
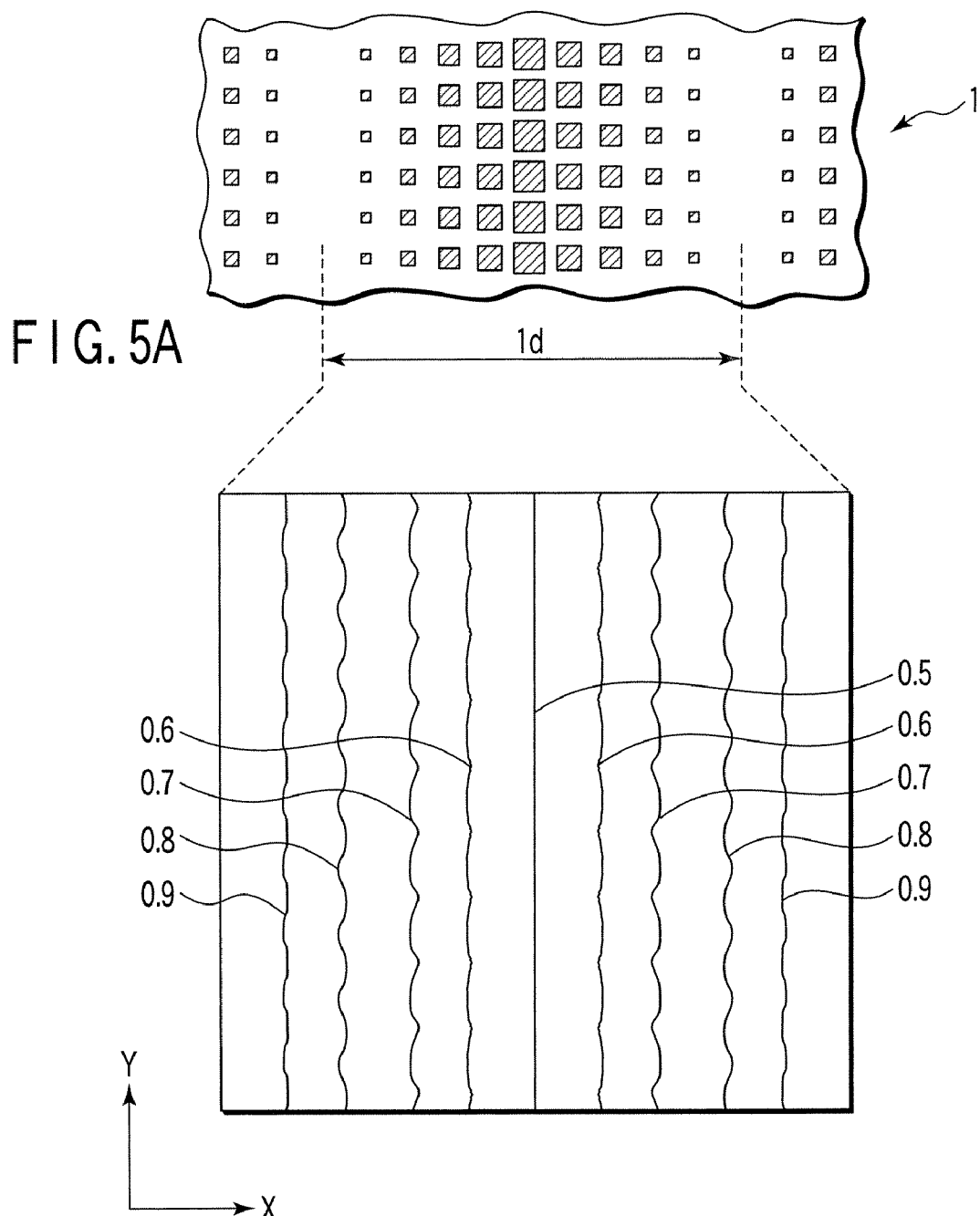

FIGS. 5A and 5B are explanatory views of a light intensity distribution formed on a processing target substrate by use of a light modulation element similar to the light modulation element shown in FIG. 3 at a time when an exit pupil of an illumination system is formed into a circular shape and a σ-value is set to 0.6; FIG. 5A is a diagram schematically showing the light modulation element, and FIG. 5B is a diagram schematically showing the light intensity distribution.

For the calculation of the light intensity distribution shown in FIG. 5B, in the same manner as in FIG. 4B, the exit pupil of the illumination system 2 is formed into a circular shape, a wavelength of the light is set to 308 nm, and an object-side numerical aperture of the image forming optical system 3 is set to 0.2. Unlike the case of FIG. 4B, however, an emission-side numerical aperture of the illumination system 2 is set to 0.12 to set the σ-value to 0.6. In the present embodiment, the wavelength of the light is 308 nm, the object-side numerical aperture of the image forming optical system 3 is 0.2, and these requirements are common to examples described below.

In the case of FIG. 5B, a V-shaped light intensity distribution is generated in a region of the image plane of the image forming optical system 3 corresponding to the center of the repeated unit region 1d. However, since the σ-value is set to be comparatively large, a wavelike undulation is generated on a contour line of the light intensity. Especially, on each of contour lines having a light intensity of 0.7 and contour lines having a light intensity of 0.8, a comparatively large wavelike undulation appears. It is recognized that this wavelike undulation enlarges as the σ-value increases. When such a wavelike undulation is generated on the contour line of the light intensity in the V-shaped light intensity distribution, the growth of the crystals is uneven owing to this wavelike undulation. In consequence, the crystal grains having the desired shape cannot be generated.

That is, a concave bottom portion which faces the contour line having a light intensity of 0.5 in the wavelike contour line has a lower temperature than peripheries of the bottom portion. The crystals grow faster in this portion having the low temperature than in the peripheries having the high temperature. As a result, the crystal grains thicker than usual grains are formed in the portion having the low temperature. In consequence, the thick crystal grains are mixed with thin crystal grains when generated as a whole. When a TFT is manufactured in a region where the thick and thin crystal grains are mixed, electric properties of the TFT inconveniently fluctuate.

As described above, in a case where the exit pupil of the illumination system 2 has a circular shape and when the σ-value is set to a comparatively large value (e.g., 0.6 or more), a desired light intensity distribution cannot be generated. On the other hand, in the crystallization apparatus, it is preferable to set the σ-value to be as large as possible. In a case where the fly-eye lens 2e of the illumination system 2 is constituted by densely arranging micro lens elements vertically and horizontally and the micro lens elements have an equal sectional size, the setting of the σ-value to a larger value permits the utilization of the light passed through a larger number of micro lens elements and the constitution of a secondary light source by a larger number of small light sources. Hence, the uniformity of the light intensity distribution of the illuminative light to the light modulation element 1 increases.

In other words, in a case where the number of the small light sources constituting the secondary light source is equal, the setting of the σ-value to a larger value permits the constitution of the fly-eye lens 2e by using larger micro lens elements, and hence the fly-eye lens 2e is easily manufactured. In the case of the optical systems 2b to 2d which guide the light from the light source 2a to the fly-eye lens 2e, the setting of the σ-value to a larger value permits the increase in a light incidence region to the fly-eye lens 2e. Therefore, a light use efficiency can be enhanced (when the light is condensed on a broad region, the light can more effectively be guided than when the light is condensed on a narrow region).

Hereinafter, with reference to FIG. 6, there will be described a light distribution generated in the pupil surface P of an image forming optical system (corresponding to the image forming optical system 3 of FIG. 1) by an object (corresponding to the light modulation element 1 of FIG. 1) O having the periodic structure. Assuming that a complex amplitude transmittance of an object O such as the duty modulation type light modulation element 1 is f(r), the complex amplitude transmittance f(r) is also a periodic function, and therefore a relation of Fourier transform represented by the following equation (2) is achieved:

$$f(r) = \int g(q) e^{iqr} dq \quad (2)$$

in which r is an in-plane coordinate vector of the object O, q is a phase gradient vector, $e^{iqr}$ is a component of the transmittance (i.e., a phase modulation amount) which linearly changes in the plane of the object O, $e^{iqr}$ is referred to as a phase gradient, and g(q) is a coefficient of the phase gradient $e^{iqr}$. Here, considering from the contribution of the phase gradient vector q at a time when a plane wave having a wave number vector k1 enters the object O, the phase gradient is added to this plane wave to generate a new plane wave having a different direction.

At this time, when the phase gradient is added to the plane wave to generate the new plane wave, the adjacent unit cells should have an equal phase gradient. When the adjacent unit cells do not have the equal phase gradient, the phase sometimes advances or delays, and the plane wave is not generated. Conditions that the adjacent unit cells have the equal phase gradient are to satisfy the following equation (3) and thus the following equation (4):

$$g(q)e^{iqr}=g(q)e^{iq(r+R)} \quad (3) \text{ and}$$

$$g(q)=g(q)e^{iqR} \quad (4)$$

in which R is a plurality of primitive translation vectors.

In order that g(q) may have a solution other than 0, $e^{iqR}=1$ needs to be established with respect to all vectors R, and a relation represented by the following equation (5) needs to be established. The phase gradient vector q which satisfies this equation (5) is a plurality of primitive reciprocal lattice vectors of the primitive translation vectors R:

$$qR=2n\pi \text{ (n is an integer)} \quad (5).$$

Next, a direction of the plane wave generated by one phase gradient vector q is considered. A light distribution $I_1(r)$ generated immediately before the object O by the plane wave having the wave number vector k1 is represented by the following equation (6). A light distribution $I_2(r)$ generated immediately after the object O is obtained by applying the phase gradient $e^{iqr}$ to the light distribution $I_1(r)$ and represented by the following equation (7):

$$I_1(r)=e^{ik1r} \quad (6) \text{ and}$$

$$I_2(r)=I_1(r)e^{iqr}=e^{i(k1+q)r} \quad (7).$$

Therefore, it is understood that a direction cosine vector (in the plane of the object O) of the wave number vector of the wave surface generated by the light distribution $I_2(r)$ is k1xy+q, in which k1xy is a direction cosine vector of k1. A direction cosine vector k2xy of a wave number vector k2 indicating the newly generated wave surface is represented by the following equation (8):

$$k2xy=k1xy+q \quad (8).$$

Figure 8:
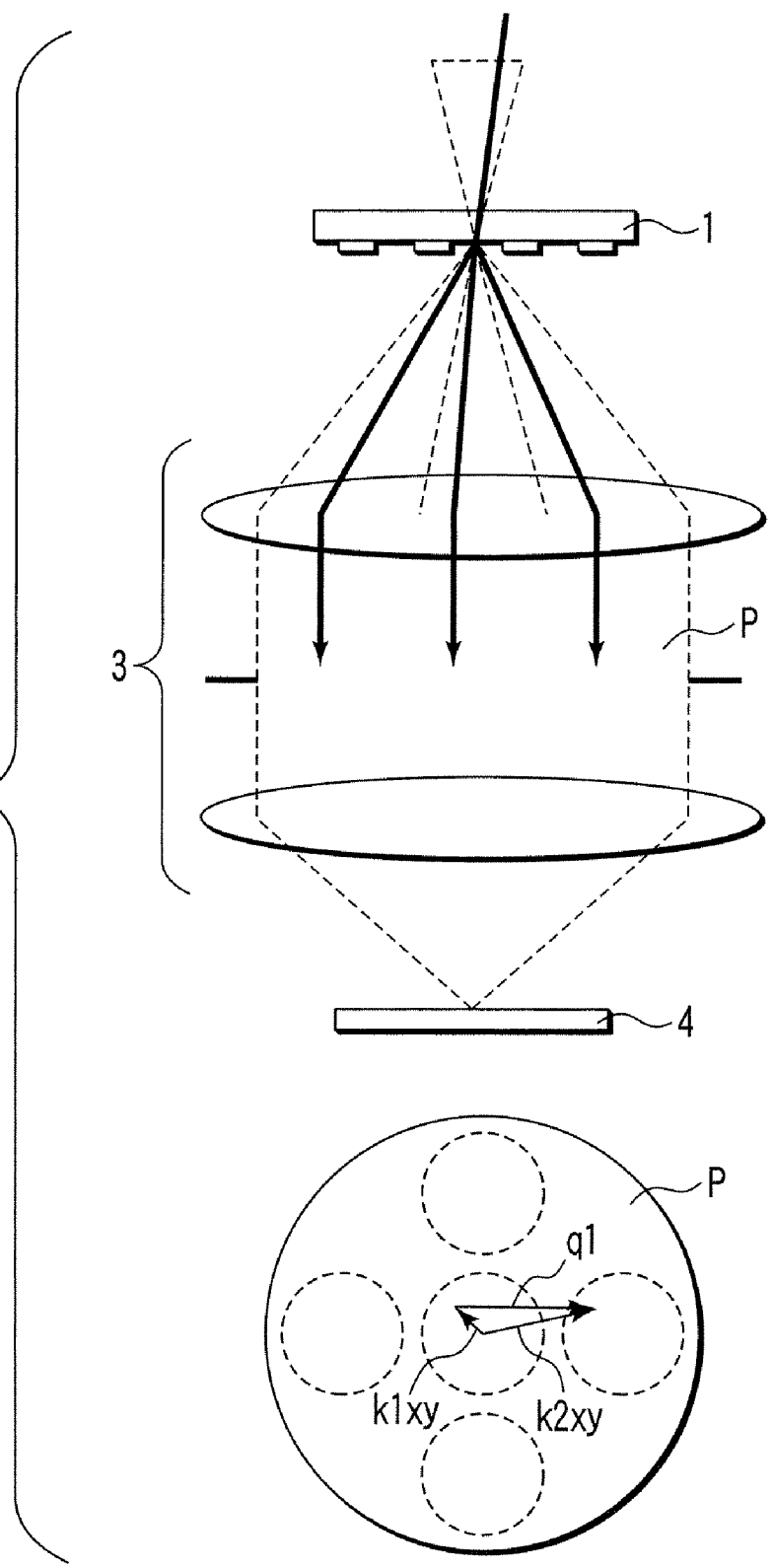
FIG. 8 is a diagram showing that a light intensity distribution in a pupil surface of an image forming optical system during partial coherent illumination becomes a distribution in which a shape of an exit pupil of an illumination system is superimposed upon a lattice point of FIG. 7, and in this figure, a pupil surface P is shown in both of a side view and a plan view.

Here, it is understood that the light intensity distribution in the pupil surface P of the image forming optical system is determined by the primitive translation vector of the periodic structure of an object O such as the duty modulation type light modulation element 1 and the shape of the exit pupil of the illumination system. That is, the light intensity distribution in the pupil surface P of the image forming optical system 3 in the present embodiment becomes a distribution in which the shape of the exit pupil of the illumination system 2 is superimposed upon a lattice point determined by a reciprocal lattice of the primitive translation vector of the periodic structure of the duty modulation type light modulation element 1. This behavior is shown in FIGS. 7 and 8.

That is, FIG. 7 shows that in the case of coherent illumination, the light intensity distribution in the pupil surface P of the image forming optical system 3 becomes a lattice structure determined by primitive reciprocal lattice vectors q1, q2 of the primitive translation vectors R of the periodic structure of the light modulation element 1. FIG. 8 shows that in the case of partial coherent illumination, the light intensity distribution in the pupil surface P of the image forming optical system 3 becomes a distribution in which the shape (a circular shape in this case) of the exit pupil of the illumination system 2 is superimposed upon the lattice point of FIG. 7 as a result of integration. Specific examples will hereinafter be described with reference to FIGS. 7 and 8.

Figure 9:
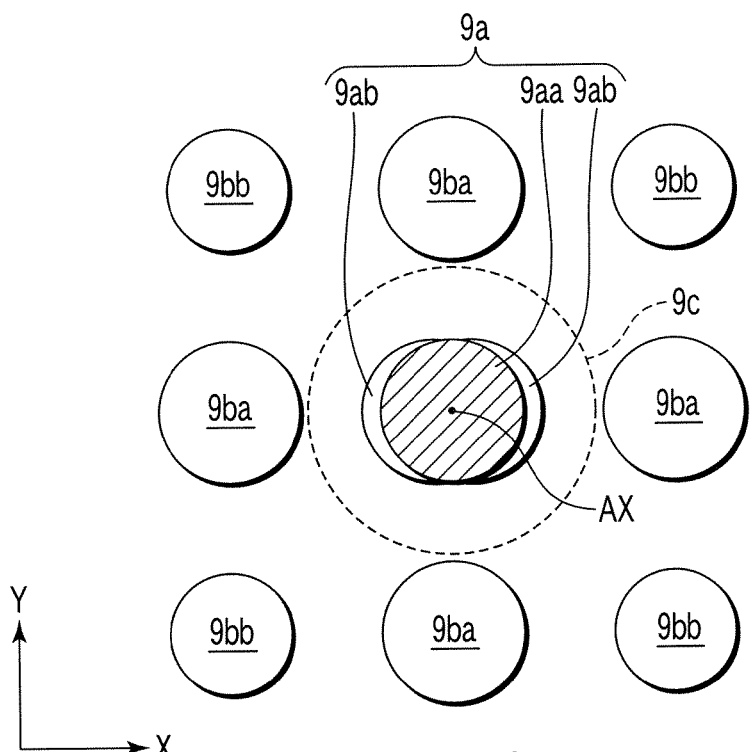
FIG. 9 is a diagram schematically showing a calculation result of a light intensity distribution obtained in a pupil surface of an image forming optical system by use of the light modulation element of FIG. 3 on the conditions (the σ-value=0.5) of FIG. 4.
Figure 10:
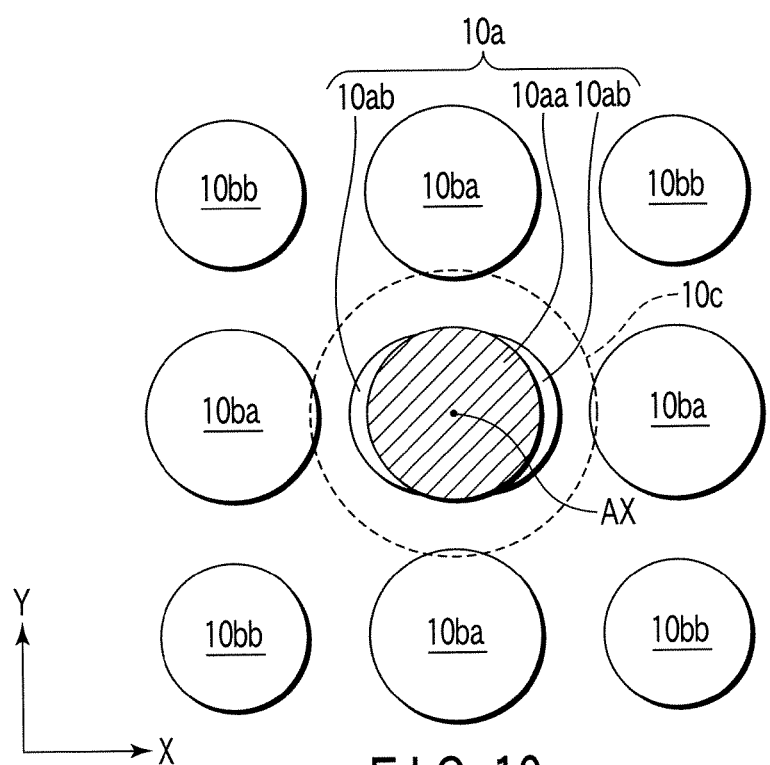
FIG. 10 is a diagram schematically showing a calculation result of a light intensity distribution obtained in a pupil surface of an image forming optical system by use of the light modulation element of FIG. 3 on the conditions (the σ-value=0.6) of FIG. 5.

FIG. 9 is a diagram schematically showing a calculation result of the light intensity distribution obtained in the pupil surface of the image forming optical system by use of the light modulation element of FIG. 3 on the conditions (the σ-value=0.5) of FIG. 4. FIG. 10 is a diagram schematically showing a calculation result of the light intensity distribution obtained in the pupil surface of the image forming optical system by use of the light modulation element of FIG. 3 on the conditions (the σ-value=0.6) of FIG. 5. First, an x-axis and a y-axis (corresponding to the X-axis and the Y-axis of FIG. 3) are set in the plane of the duty modulation type light modulation element 1, and an optical axis of the image forming optical system 3 is set to a z-axis. Accordingly, primitive translation vectors a1 and a2 of the periodic structure of the light modulation element 1 are represented by the following equations (9a) and (9b):

$$a1=(1.0, 0.0, 0.0) \mu m \quad (9a) \text{ and}$$

$$a2=(0.0, 1.0, 0.0) \mu m \quad (9b).$$

Primitive reciprocal lattice vectors b1 and b2 obtained from the primitive translation vectors a1 and a2 are defined by the following equations (10a) and (10b), respectively. At this time, as a3, a vector which is parallel to the z-axis and has an arbitrary size, for example, (0, 0, 1) may be used.

$$b1=2\pi(a2 \times a3)/(a1 \cdot (a2a3)) \quad (10a) \text{ and}$$

$$b2=2\pi(a3 \times a1)/(a1 \cdot (a2 \times a3)) \quad (10b),$$

in which "×" is an outer product of the vector, and "·" is an inner product of the vector.

When the primitive translation vectors a1 and a2 represented by the equations (9a) and (9b) are substituted into the equations (10a) and (10b), respectively, the primitive reciprocal lattice vectors b1 and b2 are represented by the following equations (11a) and (11b), respectively:

$$b1=2\pi(1.0, 0.0, 0.0) \mu m^{-1} \quad (11a) \text{ and}$$

$$b2=2\pi(0.0, 1.0, 0.0) \mu m^{-1} \quad (11b).$$

These primitive reciprocal lattice vectors b1 and b2 are divided by a wave number k (=$2\pi/\lambda$: λ is a wavelength of the light) to obtain vectors b1' and b2' which extract an x-component and a y-component, and the obtained vectors b1' and b2' determine the lattice structure of the pupil surface of the image forming optical system 3. Since λ=0.308 μm, the vectors b1' and b2' are represented by the following equations (12a) and (12b):

$$b1'=(1/k) \times b1=(0.0, 308, 0.0) \quad (11a) \text{ and}$$

$$b2'=(1/k) \times b2=(0.0, 0.0, 308) \quad (11b),$$

in which "×" is not the outer product of the vector but ordinary multiplication.

Furthermore, in the case of the partial coherent illumination, a light distribution pattern in the pupil surface of the image forming optical system 3 becomes a structure in which the shape of the exit pupil of the illumination system 2 is superimposed upon each lattice point as the center. In the light intensity distributions of FIGS. 9 and 10, central luminous fluxes 9a, 10a around an optical axis AX correspond to zero-dimensional light from the light modulation element 1, and eight peripheral luminous fluxes 9ba and 9bb or 10ba and 10bb surrounding the central luminous fluxes 9a, 10a correspond to first order diffracted light from the light modulation element 1. As the case may be, peripheral luminous fluxes corresponding to two-dimensionally diffracted light are sometimes generated externally from the peripheral luminous fluxes 9ba and 9bb or 10ba and 10bb corresponding to the first order diffracted light.

Specifically, in the light intensity distribution of FIG. 9, a radius of a hatched circular portion 9aa of the central luminous flux 9a is 0.1 corresponding to the emission-side numerical aperture of the illumination system 2 which is the condition of FIG. 4B. Of eight peripheral luminous fluxes 9ba, 9bb, each of four circular peripheral luminous fluxes 9ba arranged on upper, lower, left and right sides of the central luminous flux 9a in the figure has a radius of 0.1 as in the circular portion 9aa of the central luminous flux 9a. Each of the other four circular peripheral luminous fluxes 9bb has a radius smaller than 0.1 which is the radius of the circular portion 9aa of the central luminous flux 9a.

On the other hand, in the light intensity distribution of FIG. 10, a radius of a hatched circular portion 10aa of the central luminous flux 10a is 0.12 corresponding to the emission-side numerical aperture of the illumination system 2 which is the condition of FIG. 5B. Of eight peripheral luminous fluxes 10ba, 10bb, each of four circular peripheral luminous fluxes 10ba arranged on upper, lower, left and right sides of the central luminous flux 10a in the figure has a radius of 0.12 as in the circular portion 10aa of the central luminous flux 10a. Each of the other four circular peripheral luminous fluxes 10bb has a radius smaller than 0.12 which is the radius of the circular portion 10aa of the central luminous flux 10a.

A distance between the center of the circular portion 9aa (10aa) of the central luminous flux 9a (10a) and the center of the left or right peripheral luminous flux 9ba (10ba) in the figure is 0.308 corresponding to an x-direction component of the vector b1' corresponding to the primitive reciprocal lattice vector b1. A distance between the center of the circular portion 9aa (10aa) of the central luminous flux 9a (10a) and the center of the upper or lower peripheral luminous flux 9ba (10ba) in the figure is 0.308 which corresponds to a y-direction component of the vector b2' corresponding to the primitive reciprocal lattice vector b2. A light intensity (the light intensity at a time when an intensity in the case of non-modulation is standardized to 1; this also applies to the following) of the circular portion 9aa (10aa) of the central luminous flux 9a (10a) is in a range of 0.7 to 0.8. Each peripheral portion 9ab (10ab) of the central luminous flux 9a (10a), and each of the peripheral luminous fluxes 9ba (10ba) and 9bb (10bb) have a light intensity in a range of 0.1 to 0.2. A circle 9c, 10c shown by a broken line in FIGS. 9 and 10 is an opening of the image forming optical system 3 shown by a circle having the optical axis as the center, and has a radius of 0.2 corresponding to the object-side numerical aperture of the image forming optical system 3.

With reference to the calculation results (simulation results) of FIGS. 9 and 10, a blur of weak light shown as the peripheral portion 9ab, 10ab is observed around the circular portion 9aa, 10aa of the central luminous flux 9a, 10a corresponding to the zero-dimensional light from the light modulation element 1. The blur 9ab, 10ab of this weak light is a modulation component generated at a time when the area share ratio (the duty ratio) D changes in the duty modulation type light modulation element 1. In order that this modulation component realizes an intensity gradient, the object-side numerical aperture of the image forming optical system 3 needs to be determined so as to take this light into the opening 9c, 10c (into the pupil) of the image forming optical system 3.

Next, a cause for generating the wavelike undulation on the contour line of the light intensity in the V-shaped light intensity distribution shown in FIG. 5B will be described. FIG. 9 shows the calculation result of the light intensity distribution obtained in the pupil surface of the image forming optical system 3 on the conditions (the σ-value=0.5) of FIG. 4B. In FIG. 9, all of the peripheral luminous fluxes 9ba and 9bb corresponding to the first order diffracted light from the light modulation element 1 are present outside the opening 9c of the image forming optical system 3, and are not taken into the pupil of the image forming optical system 3. On the other hand, FIG. 10 shows the calculation result of the light intensity distribution obtained in the pupil surface of the image forming optical system 3 on the conditions (the σ-value=0.6) of FIG. 5B. In FIG. 10, a part of each peripheral luminous flux 10ba, 10bb corresponding to the first order diffracted light from the light modulation element 1 passes through the opening 10c of the image forming optical system 3, and is taken into the pupil of the image forming optical system 3. A first order diffracted light component taken into the pupil of the image forming optical system 3 is pattern information of the phase modulation region of the light modulation element 1. Therefore, in the light intensity distribution in the image plane shown in FIG. 5B, the pattern of an optical modulation region of the light modulation element 1 appears, and this forms the wavelike undulation on the contour line of the light intensity.

As described above, while a necessary area of the exit pupil of the illumination system 2 is kept, the shape of the exit pupil is changed from the circular shape to another appropriate shape, and a part of each luminous flux corresponding to the first order diffracted light from the light modulation element 1 does not pass through the opening of the image forming optical system 3 (is not superimposed upon the opening). In this case, while a σ-value of, for example, 0.6 or more is maintained, the generation of the wavelike undulation on the contour line of the light intensity can substantially be avoided. That is, in a case where the shape of the exit pupil of the illumination system 2 which illuminates the light modulation element 1 is set to a shape other than the circular shape so that the first order diffracted light from the light modulation element 1 does not substantially pass through the opening of the pupil surface of the image forming optical system 3, the generation of the wavelike undulation on the contour line of the light intensity can substantially be avoided while a comparatively large σ-value is maintained. When the area of the exit pupil of the illumination system 2 is unchanged, an effect of uniforming the light intensity of the incident luminous flux upon the light modulation element 1 does not change. As described above, the present inventor has noted the relation between the periodic structure of the duty modulation type light modulation element and the shape of the exit pupil of the illumination system, and has found that when the shape of the exit pupil of the illumination system is optimized in accordance with the periodic structure of the light modulation element, the desired light intensity distribution is obtained without any wavelike undulation, even if the σ-value is set to be comparatively large.

One solution which satisfies the conditions that a part of each luminous fluxes corresponding to the first order diffracted light from the light modulation element 1 does not overlap with the opening of the image forming optical system 3 is that the shape of the exit pupil of the illumination system 2 is not formed into a convex shape in a direction of the primitive reciprocal lattice vector (b1, b2). That is, to satisfy the conditions that a part of each luminous flux corresponding to the first order diffracted light from the light modulation element 1 does not overlap with the opening of the image forming optical system 3, it is important that the shape of the exit pupil of the illumination system 2 is not the convex shape toward the primitive reciprocal lattice vector (b1, b2) obtained from the primitive translation vector (a1, a2). The shape which complies with this specific solution is a Wigner-Seitz cell shape of the primitive reciprocal lattice vector (b1, b2). A method of generating the Wigner-Seitz cell will hereinafter be described with reference to FIG. 11. It is to be noted that FIG. 11 shows a general example in which the primitive translation vectors a1 and a2 do not cross each other at right angles.

To generate the Wigner-Seitz cell, each straight line segment 11a is first drawn to connect mutually adjacent lattice points (shown by black circles in the figure) to each other. Subsequently, each new straight line 11b is drawn which passes through a midpoint of each line segment 11a and which is vertical to the line segment 11a. As a minimum area portion surrounded with the straight lines 11b, a Wigner-Seitz cell 11c is obtained. It is to be noted that details of the Wigner-Seitz cell are described in Kittel, "Introduction to Solid Physics (upper volume)", seventh version, Publishing Division of Maruzen Co., Ltd., p 8, the entire contents of which are incorporated herein by reference.

Figure 12A:
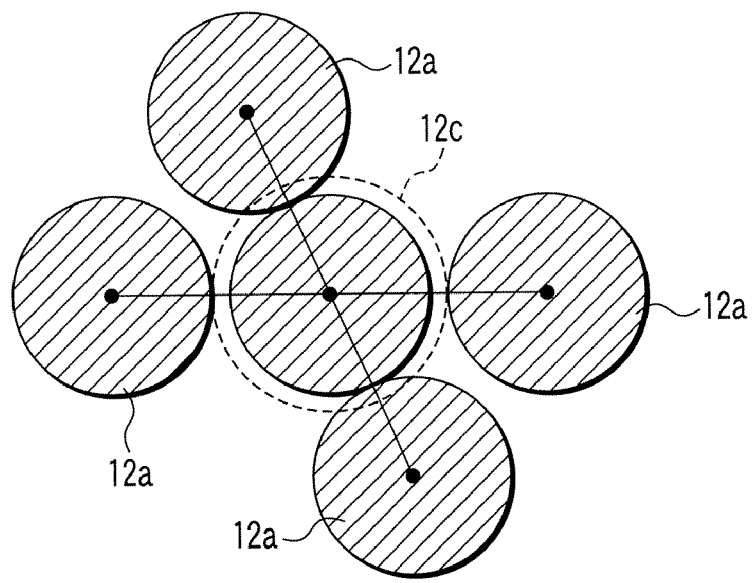
Figure 12B:
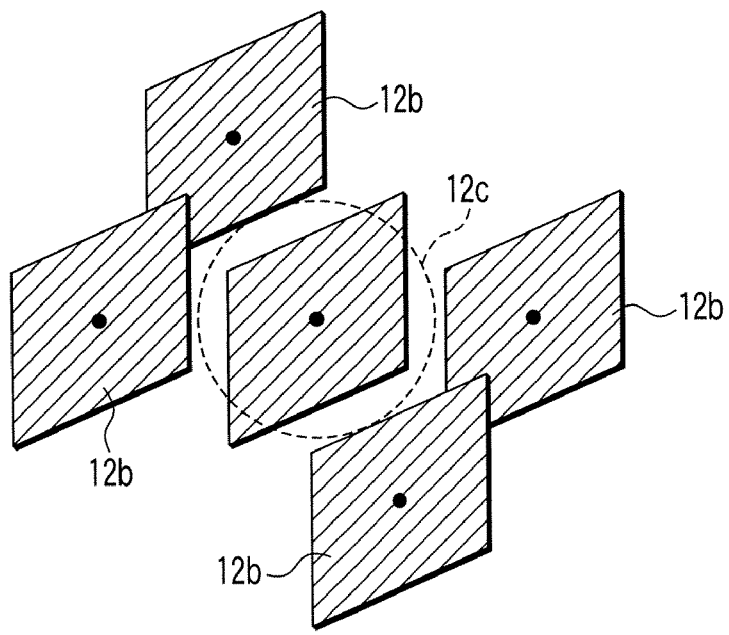
FIG. 12B shows a case where the shape of the exit pupil is set to the Wigner-Seitz cell shape.

FIGS. 12A and 12B show an effect obtained at a time when the exit pupil of the illumination system is formed into the Wigner-Seitz cell shape (a shape similar to the Wigner-Seitz cell). In FIG. 12A, since the exit pupil of the illumination system 2 is formed into the circular shape according to a conventional technology, a part of each circular peripheral luminous flux 12a corresponding to the first order diffracted light from the light modulation element 1 passes through an opening (shown by a broken line in the figure) 12c of the image forming optical system 3, and is taken into the pupil of the image forming optical system 3. On the other hand, in FIG. 12B, since the shape of the exit pupil of the illumination system 2 is set to be similar to the Wigner-Seitz cell according to the present invention, all of peripheral luminous fluxes 12b corresponding to the first order diffracted light from the light modulation element 1 and having the Wigner-Seitz cell shape (specifically, a parallelogram) are present outside the opening (shown by a broken line in the figure) 12c of the image forming optical system 3, and are not taken into the pupil of the image forming optical system 3.

That is, in the example shown in FIG. 12B, an outer shape of each peripheral luminous flux (a first order diffracted light region) 12b having the Wigner-Seitz cell shape is formed so that a portion of the peripheral luminous flux facing the circular opening 12c of the image forming optical system 3 is flat. Unlike the circular peripheral luminous flux 12a, the portion of the flux does not protrude in a convex shape toward the circular opening 12c of the image forming optical system 3. As described above, each circular peripheral luminous flux 12a (FIG. 12A) has an area equal to that of the peripheral luminous flux 12b having the Wigner-Seitz cell shape. However, a part of the circular peripheral luminous flux 12a (FIG. 12A) is taken into the pupil of the image forming optical system 3, whereas the peripheral luminous flux 12b (FIG. 12B) having the Wigner-Seitz cell shape is not at all taken into the pupil of the image forming optical system 3.

To solve the problem, according to the present embodiment, the shape of the exit pupil of the illumination system 2 is set to the Wigner-Seitz cell shape so that a part of the luminous flux corresponding to the first order diffracted light from the light modulation element 1 does not pass through the opening of the image forming optical system 3, even if the σ-value is set to be as large as, for example, 0.6. In the present embodiment, the primitive reciprocal lattice vectors b1 and b2 of the light modulation element 1 cross each other at right angles and have an equal size. Therefore, the setting of the shape of the exit pupil of the illumination system 2 to the Wigner-Seitz cell shape means that the shape of the exit pupil of the illumination system 2 is set to a square shape.

In the present embodiment, to set the shape of the exit pupil of the illumination system 2 to the square shape, a shape of an opening (a light transmitting portion) 2ga of the aperture stop 2g (not shown in FIG. 13) disposed in the vicinity of an emission surface of the second fly-eye lens 2e (not shown in FIG. 13) is set to a square shape instead of a usual circular shape as shown in FIG. 13. In FIG. 13, each rectangular section 2ea of each micro lens element constituting the second fly-eye lens 2e is shown by a broken line.

All of the rectangular sections 2ea of micro lens elements constituting the second fly-eye lens 2e do not need to have the same shape and size. The shape of the sections is not limited to a square shape, and may be, for example, a triangular shape or a polygonal shape other than a circular shape. As a result, the opening (the light transmitting portion) 2ga of the aperture stop 2g may also have a shape other than the circular shape as long as zeroth order diffracted light from the light modulation element 1 passes through the opening and the first order diffracted light does not substantially pass through the opening of the pupil surface of the image forming optical system. The opening may have, for example, the triangular shape or the polygonal shape.

When the exit pupil of the illumination system 2 has a circular shape, the emission-side numerical aperture of the illumination system 2 needs to be set to 0.12 as described above, to secure a σ-value of 0.6. At this time, the circular exit pupil of the illumination system 2 has an area of Sc=0.045 (=3.14×0.12×0.12). Moreover, when the shape of the exit pupil is set to the Wigner-Seitz cell shape to keep the area of the exit pupil of the illumination system 2, that is, when the shape is set to a square shape of 0.214×0.214 (=0.045) in the present embodiment, the exit pupil area corresponding to the σ-value of 0.6 can be secured. Here, the value corresponding to the σ-value of 0.6 means the exit pupil area equal to that of the circular exit pupil having the σ-value of 0.6.

Figure 14:
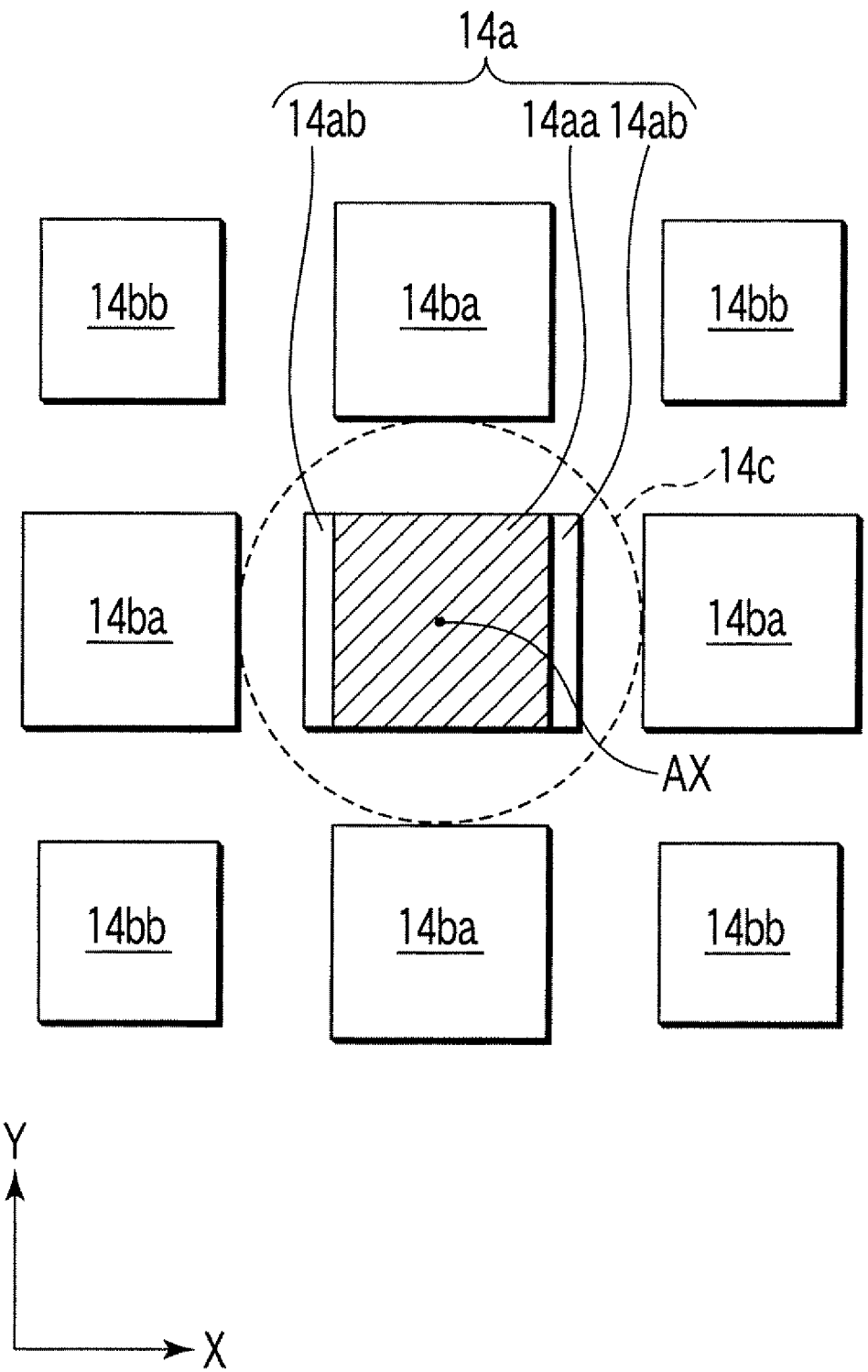
FIG. 14 is a diagram schematically showing a calculation result of a light intensity distribution obtained in a pupil surface of an image forming optical system by use of the light modulation element of FIG. 3 at a time when a shape of an exit pupil of an illumination system is set to a Wigner-Seitz cell shape and a σ-value is set to a value corresponding to 0.6.

FIG. 14 is a diagram schematically showing a calculation result of a light intensity distribution obtained in a pupil surface of an image forming optical system by use of the light modulation element of FIG. 3 at a time when a shape of an exit pupil of an illumination system is set to a Wigner-Seitz cell shape and a σ-value is set to a value corresponding to 0.6. In the light intensity distribution of FIG. 14, a central luminous flux 14a having an optical axis AX as the center corresponds to zero-dimensional light from the light modulation element 1, and eight peripheral luminous fluxes 14ba, 14bb surrounding the central luminous fluxes 14a correspond to first order diffracted light from the light modulation element 1. A length of one side of a hatched square portion 14aa of the central luminous flux 14a is 0.214 corresponding to the above square exit pupil of 0.214×0.214. Of the eight peripheral luminous fluxes 14ba, 14bb, a length of one side of each of four square peripheral luminous fluxes 14ba arranged on upper, lower, left and right sides of the central luminous flux 14a in the figure is 0.214, as in the case of the square portion 14aa of the central luminous flux 14a. A length of one side of each of the other four square peripheral luminous fluxes 14bb is smaller than that of the square portion 14aa of the central luminous flux 14a.

A distance between the center of the square portion 14aa of the central luminous flux 14a and the center of the left or right peripheral luminous flux 14ba in the figure is 0.308 corresponding to the x-direction component of the vector b1' corresponding to the primitive reciprocal lattice vector b1. A distance between the center of the square portion 14aa of the central luminous flux 14a and the center of the upper or lower peripheral luminous flux 14ba in the figure is 0.308 corresponding to the y-direction component of the vector b2' corresponding to the primitive reciprocal lattice vector b2. A light intensity of the square portion 14aa of the central luminous flux 14a is in a range of 0.7 to 0.8. Each peripheral portion 14ab of the central luminous flux 14a, and each of the peripheral luminous fluxes 14ba, 14bb have a light intensity in a range of 0.1 to 0.2. A circle 14c shown by a broken line in FIG. 14 is an opening of the image forming optical system 3 shown by a circle having the optical axis as the center, and has a radius of 0.2 corresponding to the object-side numerical aperture of the image forming optical system 3.

With reference to the calculation result (a simulation result) of FIG. 14, a blur of weak light shown as the peripheral portion 14ab is observed around the square portion 14aa of the central luminous flux 14a corresponding to the zero-dimensional light from the light modulation element 1. The blur portion 14ab of this weak light is a modulation component generated at a time when the area share ratio (the duty ratio) D changes in the duty modulation type light modulation element 1 as described above. The object-side numerical aperture of the image forming optical system 3 is determined so as to take this light into the opening 14c of the image forming optical system 3.

Figure 15A:
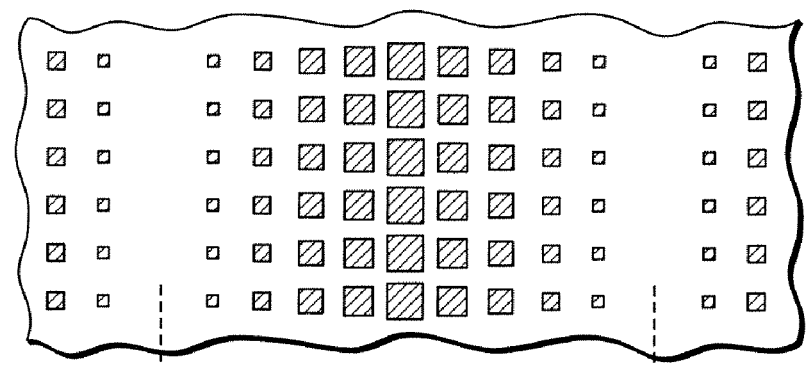
Figure 15B:
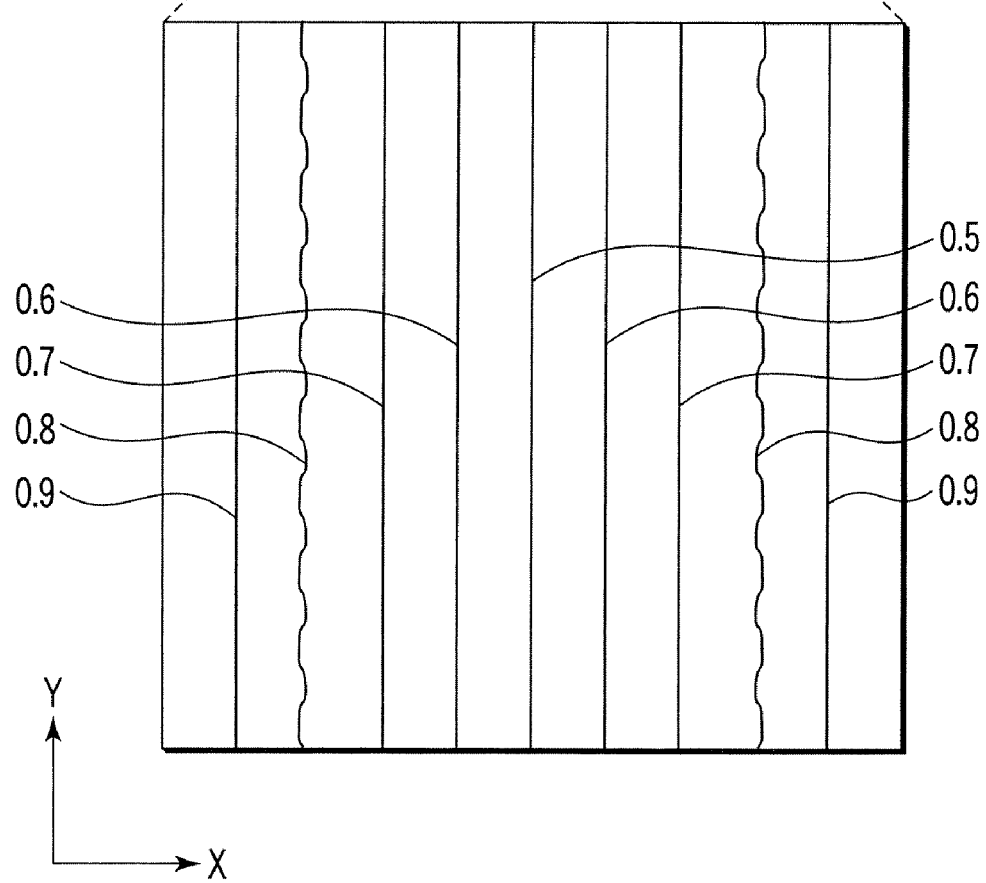

FIGS. 15A and 15B are explanatory views of a light intensity distribution formed on a processing target substrate by use of a light modulation element similar to the light modulation element shown in FIG. 3 at a time when a shape of an exit pupil of an illumination system is set to a Wigner-Seitz cell shape and a σ-value is set to a value corresponding to 0.6, FIG. 15A is a diagram schematically showing the light modulation element, and FIG. 15B is a diagram schematically showing the light intensity distribution.

In the present embodiment, the shape of the exit pupil of the illumination system 2 is set to a square shape as the Wigner-Seitz cell shape as described above. Therefore, although a comparatively large σ-value of 0.6 is secured, a part of the luminous flux corresponding to the first order diffracted light from the light modulation element 1 does not pass through the opening of the image forming optical system 3.

Therefore, as shown in FIG. 15B, in the image plane of the image forming optical system 3, a substantially ideal V-shaped light intensity distribution is generated in which the light intensity linearly changes in an X-direction from a position corresponding to the center of the repeated unit region 1d of the light modulation element 1 to positions corresponding to opposite ends, and the generation of the wavelike undulation on the contour line of the light intensity is substantially avoided. It is to be noted that in the light intensity distribution of FIG. 15B, the wavelike undulation appears on the contour line of a light intensity of 0.8. However, it is understood that the wavelike undulation is much smaller than that shown in FIG. 5B. As a result, according to the crystallization apparatus of the present embodiment, even if the σ-value (the coherence factor) is set to a comparatively large value, a desired light intensity distribution can be generated, and hence crystal grains having a desired shape can be generated.

In the light modulation element 1 used in the above embodiment, an arrangement direction of the repeated unit region 1d of the phase pattern coincides with a change direction of the area share ratio D of the phase modulation region 1b with respect to the unit cell 1c. A modification will hereinafter be described in which a light modulation element 1A is used, but this element 1A has a constitution in which the arrangement direction of the repeated unit region of the phase pattern and the change direction of the area share ratio D of the phase modulation region with respect to the unit cell form 45 degrees.

FIG. 16 is a diagram schematically showing a constitution of the light modulation element according to the modification. The light modulation element 1A of the modification shown in FIG. 16 is constituted of a repeated unit region (a unit region of a range denoted with reference numeral 1Ad) of a phase pattern arranged in the X-direction. Each repeated unit region 1Ad is constituted of square unit cells 1Ac two-dimensionally and densely arranged along a direction (hereinafter referred to as "the 45-degree oblique direction") which forms 45 degrees with respect to an X-axis and a Y-axis, as shown by a broken line in the figure.

Each unit cell 1Ac has a reference phase region (shown by a blank portion in the figure) 1Aa having a reference phase value of 0 degree and a rectangular phase modulation region (shown by a hatched portions in the figure) 1Ab having a modulating phase value of, for example, 90 degrees. An area share ratio D of the phase modulation region 1Ab with respect to the unit cell 1Ac changes in a range of 0% to 50% along the 45-degree oblique direction. Specifically, the area share ratio D of the phase modulation region 1Ab in the center of the repeated unit region 1Ad of the phase pattern is 50%, the area share ratio D of the phase modulation region 1Ab in opposite sides of the repeated unit region 1Ad is 0%, and the area share ratio D of the phase modulation region 1Ab monotonously changes along the 45-degree oblique direction between the center and each side.

FIG. 17 is a diagram schematically showing a calculation result of a light intensity distribution obtained in a pupil surface of an image forming optical system by use of the light modulation element of FIG. 16 at a time when a shape of an exit pupil of an illumination system is set to a circular shape and a σ-value is set to 0.6. In the light intensity distribution of FIG. 17, a central luminous flux 17a having the optical axis AX as the center corresponds to zero-dimensional light passed through the light modulation element 1A and emitted from the image forming optical system, and eight peripheral luminous fluxes surrounding the central luminous fluxes 17a correspond to first order diffracted light from the image forming optical system. A radius of a hatched circular portion 17aa of the central luminous flux 17a is 0.12 corresponding to the emission-side numerical aperture of the illumination system 2. Of the eight peripheral luminous fluxes, a radius of each of four circular peripheral luminous fluxes 17b positioned in 45-degree oblique directions with respect to the central luminous flux 17a is 0.12, as in the case of the circular portion 17aa of the central luminous flux 17a.

A distance between the center of the circular portion 17aa of the central luminous flux 17a and the center of the peripheral luminous flux 17b is 0.308 corresponding to a direction component of the primitive reciprocal lattice vector of the light modulation element 1A, as in the above embodiment. A light intensity (the light intensity at a time when the intensity in the case of the non-modulation is standardized to 1; this also applies to the following) of the circular portion 17aa of the central luminous flux 17a is in a range of 0.7 to 0.8. Each peripheral portion 17ab of the central luminous flux 17a and each of the peripheral luminous fluxes 17b have a light intensity in a range of 0.1 to 0.2. A circle 17c shown by a broken line in FIG. 17 is an opening of the image forming optical system 3 shown by a circle having the optical axis as the center, and has a radius of 0.2 corresponding to the object-side numerical aperture of the image forming optical system 3. Referring to FIG. 17, a part of the peripheral luminous flux 17b corresponding to the first order diffracted light from the light modulation element 1A passes through the opening 17c of the image forming optical system 3, and is taken into the pupil of the image forming optical system 3.

Figure 18:
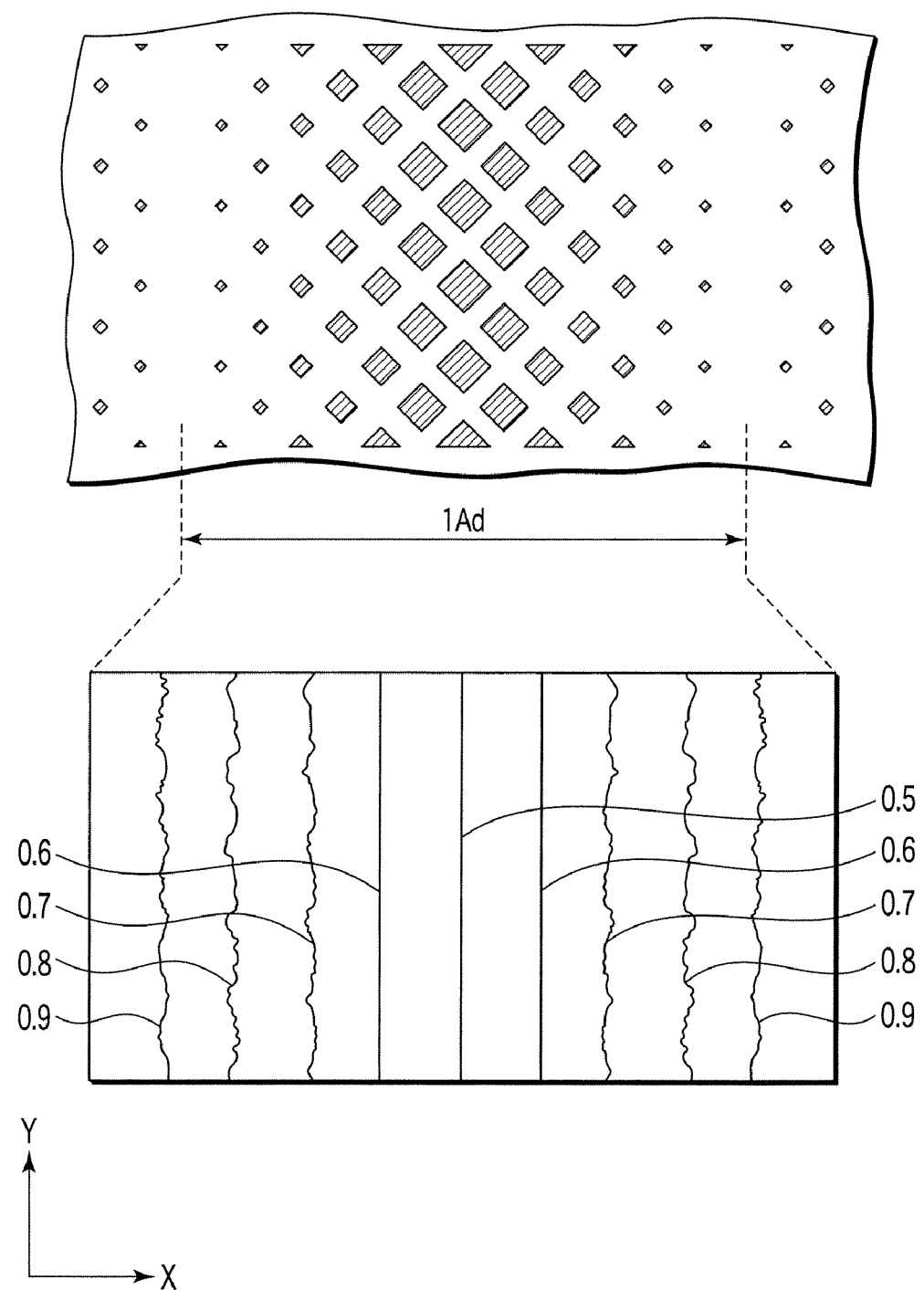
FIG. 18 is a diagram schematically showing a light intensity distribution formed on a processing target substrate by use of the light modulation element of FIG. 16 at a time when a shape of an exit pupil of an illumination system is set to a circular shape and a σ-value is set to 0.6.

FIG. 18 is a diagram schematically showing a light intensity distribution formed on a processing target substrate by use of the light modulation element of FIG. 16 at a time when a shape of an exit pupil of an illumination system is set to a circular shape and a σ-value is set to 0.6. Referring to FIG. 18, a V-shaped light intensity distribution is generated in a region of an image plane of the image forming optical system 3 corresponding to the repeated unit region 1Ad of the light modulation element 1A. Since a part of the peripheral luminous flux 17b corresponding to the first order diffracted light from the light modulation element 1A is taken into the opening 17c of the image forming optical system 3, the wavelike undulation is generated on the contour line of the light intensity. Especially, a comparatively wavelike undulation appears in each of contour lines of light intensities of 0.7, 0.8 and 0.9.

FIG. 19 is a diagram schematically showing a calculation result of a light intensity distribution obtained in a pupil surface of an image forming optical system by use of the light modulation element of FIG. 16 at a time when a shape of an exit pupil of an illumination system is set to a Wigner-Seitz cell shape and a σ-value is set to a value corresponding to 0.6. Even in the modification in which the light modulation element 1A of FIG. 16 is used, the primitive reciprocal lattice vectors of the light modulation element 1A cross each other at right angles and have an equal size, as in the case of the above embodiment. Therefore, the setting of the shape of the exit pupil of the illumination system 2 to the Wigner-Seitz cell shape means the setting of the shape of the exit pupil of the illumination system 2 to a square shape.

In the light intensity distribution of FIG. 19, a central luminous flux 19a having the optical axis AX as the center corresponds to zero-dimensional light from the light modulation element 1A, and eight peripheral luminous fluxes surrounding the central luminous fluxes 19a correspond to first order diffracted light from the light modulation element 1A. A length of one side of a hatched square portion 19aa of the central luminous flux 19a is 0.214 corresponding to the above square exit pupil of 0.214×0.214. Of the eight peripheral luminous fluxes, a length of one side of each of four square peripheral luminous fluxes 19b positioned in 45-degree oblique directions with respect to the central luminous flux 19a is 0.214, as in the case of the square portion 19aa of the central luminous flux 19a.

Moreover, a distance between the center of the square portion 19aa of the central luminous flux 19a and the center of the peripheral luminous flux 19b is 0.308 corresponding to a direction component of the primitive reciprocal lattice vector of the light modulation element 1A, as in the above embodiment. A light intensity of the square portion 19aa of the central luminous flux 19a is in a range of 0.7 to 0.8. A peripheral portion 19ab of the central luminous flux 19a and each of the peripheral luminous fluxes 19b have a light intensity in a range of 0.1 to 0.2. A circle 19c shown by a broken line in FIG. 19 is an opening of the image forming optical system 3 shown by a circle having the optical axis as the center, and has a radius of 0.2 corresponding to the object-side numerical aperture of the image forming optical system 3. It is understood from FIG. 19 that all of the central luminous flux 19a corresponding to the zero-dimensional light from the light modulation element 1A is taken into the opening 19c of the image forming optical system 3 but the peripheral luminous fluxes 19b corresponding to the first order diffracted light from the light modulation element 1A are not at all taken into the opening 19c of the image forming optical system 3.

FIG. 20 is a diagram schematically showing a light intensity distribution formed on a processing target substrate by use of the light modulation element of FIG. 16 at a time when a shape of an exit pupil of an illumination system is set to a Wigner-Seitz cell shape and a σ-value is set to a value corresponding to 0.6. Referring to FIG. 20, the peripheral luminous fluxes 19b corresponding to the first order diffracted light from the light modulation element 1A are not at all taken into the opening 19c of the image forming optical system 3. Therefore, in the image plane of the image forming optical system 3, a substantially ideal V-shaped light intensity distribution is generated in which the light intensity linearly changes from a position corresponding to the center of a repeated unit region 1Ad to positions corresponding to opposite ends. It is understood in the light intensity distribution of FIG. 20 that a wavelike undulation appears on a contour line of a light intensity of 0.9 but is very small as compared with the wavelike undulation shown in FIG. 18.

Figure 21A:
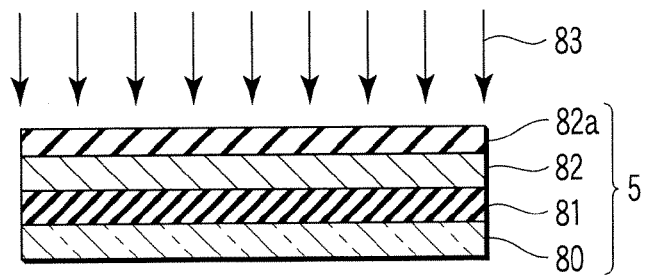
FIGS. 21A to 21E are step sectional views respectively showing steps of manufacturing an electronic device by use of a crystallization apparatus of the present embodiment.

FIGS. 21A to 21E are process cross-sectional views showing respective steps of manufacturing an electronic device in a region crystallized by using the crystallization apparatus according to this embodiment. As shown in FIG. 21A, a processing target substrate 5 is prepared. The processing target substrate 5 is obtained by sequentially forming an underlying film 81 (e.g., a film like a laminated film containing SiN having a film thickness of 50 nm and $SiO_2$ having a film thickness of 100 nm), an amorphous semiconductor film 82 (a semiconductor film containing, e.g., Si, Ge, or SiGe having a film thickness of 50 nm to 20 nm), and a cap film 82a (e.g., an $SiO_2$ film having a film thickness of 30 nm to 300 nm) on a transparent insulating substrate 80 (formed of, e.g., alkali glass, quartz glass, plastic, or polyimide) by a chemical vapor deposition method or a sputtering method. Then, a predetermined region on a surface of the amorphous semiconductor film 82 is temporarily irradiated with a laser beam 83 (e.g., a KrF excimer laser beam or an XeCl excimer laser beam) once or more by using the crystallization method and apparatus according to the embodiment described above, thereby growing the above-explained needle-like crystals having a similar shape.

Figure 21B:
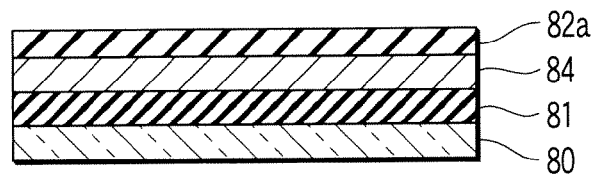
Figure 21C:
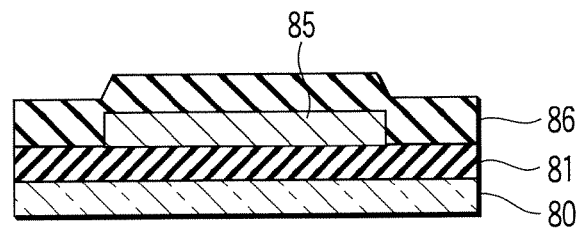
Figure 21D:
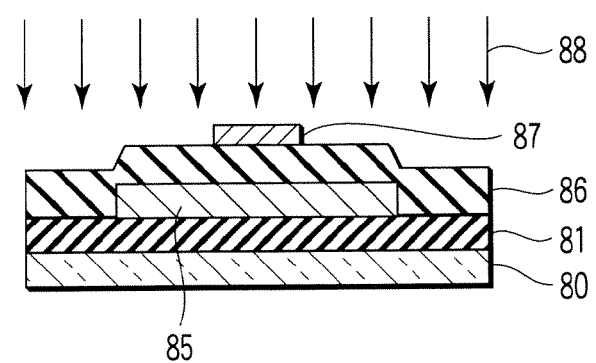
Figure 21E:
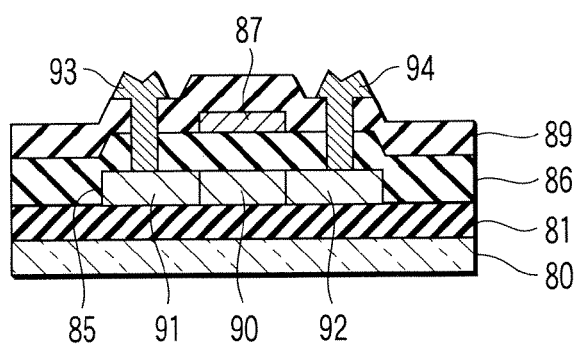
Figure 22A:
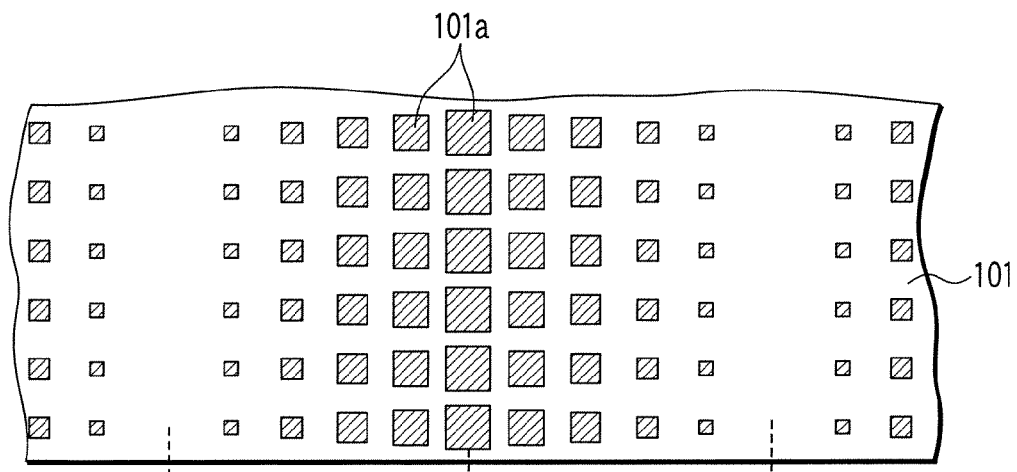
FIGS. 22A to 22C are schematic explanatory views of a conventional crystallization technology.
Figure 22B:
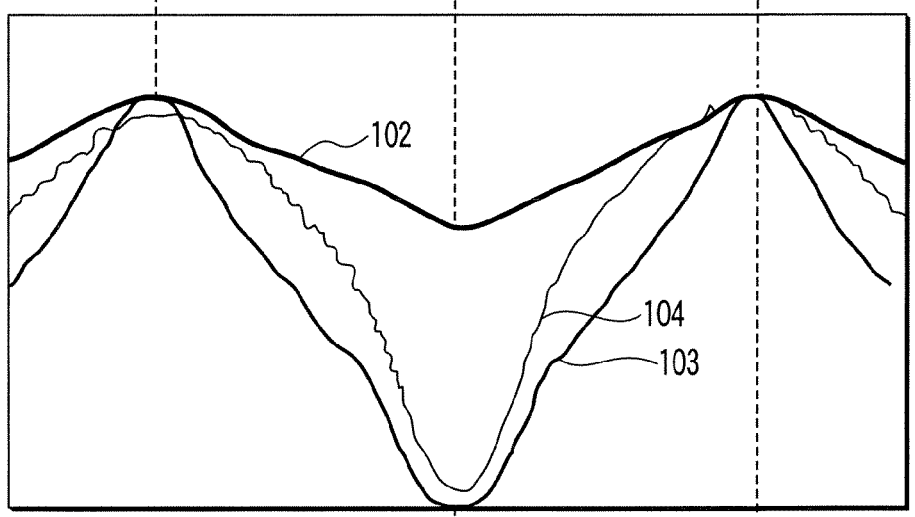
Figure 22C:
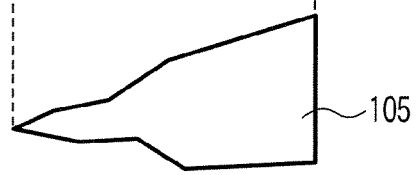

In this manner, as shown in FIG. 21B, a polycrystal semiconductor film or a single-crystallized semiconductor film (a crystallized region) 84 having crystal particles with a similar shape is formed in the irradiation region of the amorphous semiconductor film 82. Subsequently, the cap film 82a is removed from the semiconductor film 84 by etching. Thereafter, as shown in FIG. 21C, the polycrystal semiconductor film or the single-crystallized semiconductor film 84 is processed into, e.g., a plurality of island-shaped semiconductor films (crystallized island-shaped regions) 85 each serving as a region in which a thin film transistor is formed by using a photolithography technology. An $SiO_2$ film having a film thickness of 20 nm to 100 nm is formed as a gate insulating film 86 on a surface of the semiconductor film 85 by using the chemical vapor deposition method or the sputtering method. Moreover, as shown in FIG. 21D, a gate electrode 87 (made of a metal e.g., silicide or MoW) is formed on a part of the gate insulating film, and the gate electrode 87 is used as a mask to implant impurity ions 88 (phosphor in case of an N-channel transistor, or boron in case of a P-channel transistor) into the semiconductor film 85 as indicated by arrows. Then, annealing processing (e.g., at 450° C. for one hour) is carried out in a nitrogen atmosphere to activate the impurity, thereby forming a source region 91 and a drain region 92 in the island-shaped semiconductor film 85 on both sides of a channel region 90. A position of such a channel region 90 is set in such a manner that a carrier moves in a growth direction of each needle-like or elongate crystal. Then, as shown in FIG. 21E, an interlayer insulating film 89 that covers the entire product is formed, and contact holes are formed in this interlayer insulating film 89 and the gate insulating film 86, and then a source electrode 93 and a drain electrode 94 are formed in the holes so that they are respectively connected with the source region 91 and the drain region 92.

At the above-explained steps, when the gate electrode 87 is formed in accordance with a position in a plane direction of each crystal having a large particle diameter of the polycrystal semiconductor film or the single-crystallized semiconductor film 84 generated at the steps depicted in FIGS. 21A and 12B, thereby forming the channel 90 below the gate electrode 87. With the above-explained steps, a polycrystal transistor or a thin film transistor (TFT) in the single-crystallized semiconductor can be formed. The thus manufactured polycrystal transistor or single-crystallized transistor can be applied to a drive circuit of a liquid crystal display (a display) or an EL (electroluminescence) display or an integrated circuit, e.g., a memory (an SRAM or a DRAM) or a CPU. The processing target in the present invention is not restricted to one on which a semiconductor device is formed, and the semiconductor device is not restricted to a TFT either.

In the above explanation, the present invention is carried out by using a phase modulation type light modulation element as the light modulation element. However, the present invention is not restricted thereto. The present invention can be carried out by using a light modulation element adopting other modes, e.g., a transmission type light modulation element having a predetermined transmission pattern or a reflection type light modulation element having a predetermined reflection pattern, or a light modulation element that is a combination of these elements having a first modulation region where a first light intensity distribution in which a light intensity varies in a first direction of the light modulation element is generated on an irradiation target plane and a second modulation region where a second light intensity distribution in which a light intensity varies in a second direction different from the first direction is generated on the irradiation target plane.

Additionally, the present invention is applied to the crystallization apparatus and the crystallization method of irradiating the non-single crystal semiconductor film with light having a predetermined light intensity distribution to generate the crystallized semiconductor film in the above explanation. However, the present invention is not restricted thereto, and can be generally applied to a light irradiation apparatus that forms a predetermined light intensity distribution on a predetermined irradiation target plane via the image forming optical system.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A light irradiation apparatus which irradiates an irradiation target plane with light having a predetermined light intensity distribution, comprising:
    a light modulation element having a light modulation pattern of a periodic structure represented by primitive translation vectors (a1, a2);
    an illumination system which has an exit pupil and, illuminates the light modulation element with the light; and
    an image forming optical system disposed between the light modulation element and the irradiation target plane to form the predetermined light intensity distribution of the light obtained by the light modulation pattern on the irradiation target plane,
    wherein a shape of the exit pupil of the illumination system is analogous to the Wigner-Seitz cell of primitive reciprocal lattice vectors (b1, b2) obtained from the primitive translation vectors (a1, a2) by the following equations:

$$b1=2\pi(a2 \times a3)/(a1 \cdot (a2 \times a3))$$ and $$b2=2\pi(a3 \times a1)/(a1 \cdot (a2 \times a3))$$

in which a3 is a vector having an arbitrary size in a normal direction of a flat surface of the light modulation pattern of the light modulation element, "·" is an inner product of the vector, and "×" is an outer product of the vector.

2. A light irradiation apparatus which irradiates an irradiation target plane with light having a predetermined light intensity distribution, comprising:
    a light modulation element having a light modulation pattern of a periodic structure represented by primitive translation vectors (a1, a2);
    an illumination system which has an exit pupil, and illuminates the light modulation element; and
    an image forming optical system disposed between the light modulation element and the irradiation target plane to form the predetermined light intensity distribution of the light corresponding to the light modulation pattern on the irradiation target plane,
    wherein a shape of the exit pupil of the illumination system is not a convex shape with respect to a direction of primitive reciprocal lattice vectors (b1, b2) obtained from the primitive translation vectors (a1, a2) by the following equations:

$$b1=2\pi(a2 \times a3)/(a1 \cdot (a2 \times a3))$$ and $$b2=2\pi(a3 \times a1)/(a1 \cdot (a2 \times a3))$$

in which a3 is a vector having an arbitrary size in a normal direction of a light modulation pattern plane of the light modulation element, "·" is an inner product of the vector, and "×" is an outer product of the vector.

3. A light irradiation apparatus which irradiates an irradiation target plane with light having, a predetermined light intensity distribution, comprising:
    a light modulation element which optically modulates incident light to emit the modulated light;
    an illumination system which has an exit pupil, and illuminates the light modulation element;
    an image forming optical system disposed between the light modulation element and the irradiation target plane to form the predetermined light intensity distribution of the light corresponding to the modulated light on the irradiation target plane; and
    an exit pupil shape setting section which sets a shape of the exit pupil of the illumination system to a shape other than a circular shape which allows zero-dimensionally diffracted light from the light modulation element to pass and which does not allow one-dimensionally diffracted light to substantially pass through an opening of a pupil surface of the image forming optical system.

4. A method comprising:
irradiating an irradiation target plane with light having a predetermined light intensity distribution by use of a light modulation element which has an irradiation target pattern of a periodic structure for optically modeling incident light and an image forming optical system disposed between the light modulation element and the irradiation target plane, wherein a shape of an exit pupil of an illumination system which illuminates the light modulation element is set to a shape other than a circular shape which allows zero-dimensionally diffracted light from the light modulation element to pass and which does not allow a one-dimensionally diffracted light component of the light from the light modulation element to substantially pass through an opening of a pupil surface of the image forming optical system, so that generation of wavelike undulation of the light intensity is substantially avoided.

5. The light irradiation apparatus according to claim 1 or 2, wherein the primitive translation vectors a1 and a2 cross each other at right angles.

6. A crystallization apparatus comprising:
the light irradiation apparatus according to any one of claims 1 to 3, and
a stage which holds a non-single crystal semiconductor film having one surface on which the irradiation target plane is set,
wherein at least a part of said one surface of the non-single crystal semiconductor film is irradiated with the light having the predetermined light intensity distribution to form a crystallized semiconductor film.

7. A crystallization method which comprises irradiating at least a part of a non-single crystal semiconductor film set on the irradiation target plane with light having a predetermined light intensity distribution by use of the light irradiation apparatus according to any one of claims 1 to 3 or the light irradiation method according to claim 4, to form a crystallized semiconductor film.

8. A semiconductor device manufactured by using the crystallization apparatus according to claim 6.

9. The light irradiation apparatus of claim 1, wherein the shape of the exit pupil of the illumination system is set to the Wigner-Seitz cell.

10. The method of claim 4, further comprising:
forming a semiconductor device from the irradiation target plane.

* * * * *